United States Patent
Majhi et al.

(10) Patent No.: US 12,451,420 B2
(45) Date of Patent: Oct. 21, 2025

(54) STAIRCASE-BASED METAL-INSULATOR-METAL (MIM) CAPACITORS

(71) Applicant: Intel Corporation, Santa Clara, CA (US)

(72) Inventors: Prashant Majhi, San Jose, CA (US); Anand Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 824 days.

(21) Appl. No.: 17/455,698

(22) Filed: Nov. 19, 2021

(65) Prior Publication Data

US 2023/0163063 A1 May 25, 2023

(51) Int. Cl.
    H01L 23/522 (2006.01)
    H10D 1/00 (2025.01)
    H10D 1/68 (2025.01)

(52) U.S. Cl.
    CPC ......... H01L 23/5223 (2013.01); H10D 1/692 (2025.01)

(58) Field of Classification Search
    CPC .... H01L 23/5223; H10D 1/692; H10D 1/716; H10D 1/714
    See application file for complete search history.

(56) References Cited

U.S. PATENT DOCUMENTS

| | | |
|---|---|---|
| 8,493,709 B2 | 7/2013 | Chung |
| 10,002,787 B2 | 6/2018 | Yu et al. |
| 2009/0230449 A1* | 9/2009 | Sakaguchi ............... H10D 1/47 257/E27.081 |
| 2013/0277799 A1 | 10/2013 | Chen et al. |
| 2016/0365351 A1* | 12/2016 | Nishikawa ............... H10D 1/47 |
| 2018/0323199 A1* | 11/2018 | Roberts ................. H01L 23/528 |

(Continued)

FOREIGN PATENT DOCUMENTS

| | | |
|---|---|---|
| DE | 102018107387 A1 | 3/2019 |
| EP | 3262680 B1 | 8/2019 |

(Continued)

OTHER PUBLICATIONS

Extended European Search Report received for EP application No. 22200347.7, dated Mar. 16, 2023. 9 pages.

*Primary Examiner* — Omar F Mojaddedi
(74) *Attorney, Agent, or Firm* — Finch & Maloney PLLC

(57) ABSTRACT

Multi-plate MIM capacitors include a staircase structure, with steps including a high-k capacitor dielectric and one or more electrode plates. Contacts pass through insulator fill material and land on the electrode plate of a respective step. A recess passes through the staircase structure. In some examples, the recess is filled with insulator material, and steps of the staircase structure have a bilayer structure (e.g., lower layer of capacitor dielectric and upper layer of capacitor electrode plate). In other examples, the recess is filled with conductive material. In such cases, steps of the staircase structure have a multilayer structure that includes an upper portion and a lower portion. The lower portion includes insulator material and the upper portion includes a layer of capacitor dielectric between first and second capacitor electrode plates, with the second capacitor electrode plates being continuous with, or otherwise in contact with, the conductive material in the recess.

20 Claims, 19 Drawing Sheets

(56) References Cited

U.S. PATENT DOCUMENTS

| | | | | |
|---|---|---|---|---|
| 2022/0102267 A1* | 3/2022 | Chen | ................... | H01L 23/5286 |
| 2022/0102370 A1* | 3/2022 | Kwon | ................... | H01L 23/535 |
| 2022/0139821 A1* | 5/2022 | Hwang | ............... | H01L 23/5228 |
| | | | | 257/324 |

FOREIGN PATENT DOCUMENTS

| | | | |
|---|---|---|---|
| WO | 2016205078 | A2 | 12/2016 |
| WO | 2020223945 | A1 | 11/2020 |

* cited by examiner

STAIRCASE-BASED METAL-INSULATOR-METAL (MIM) CAPACITORS

FIELD OF THE DISCLOSURE

The present disclosure relates to integrated circuits, and more particularly, to capacitors.

BACKGROUND

As integrated circuit scaling continues, it is becoming increasingly difficult to support high power delivery. For instance, decoupling capacitors can be used to provide filtering of power signals, so as to remove ripple or alternating current (AC) signals from a direct current (DC) power supply. Such decoupling capacitors can be implemented as metal-insulator-metal (MIM) capacitors in the backend interconnects, adjacent to the power rails (e.g., $V_{CC}$, $V_{DD}$, $V_{SS}$). The filtered power supply signals can be routed through the interconnect structure down to the underlying device layer. There remain a number of non-trivial issues associated with providing such decoupling capacitors, particularly with respect to parasitics.

Figure 1A:
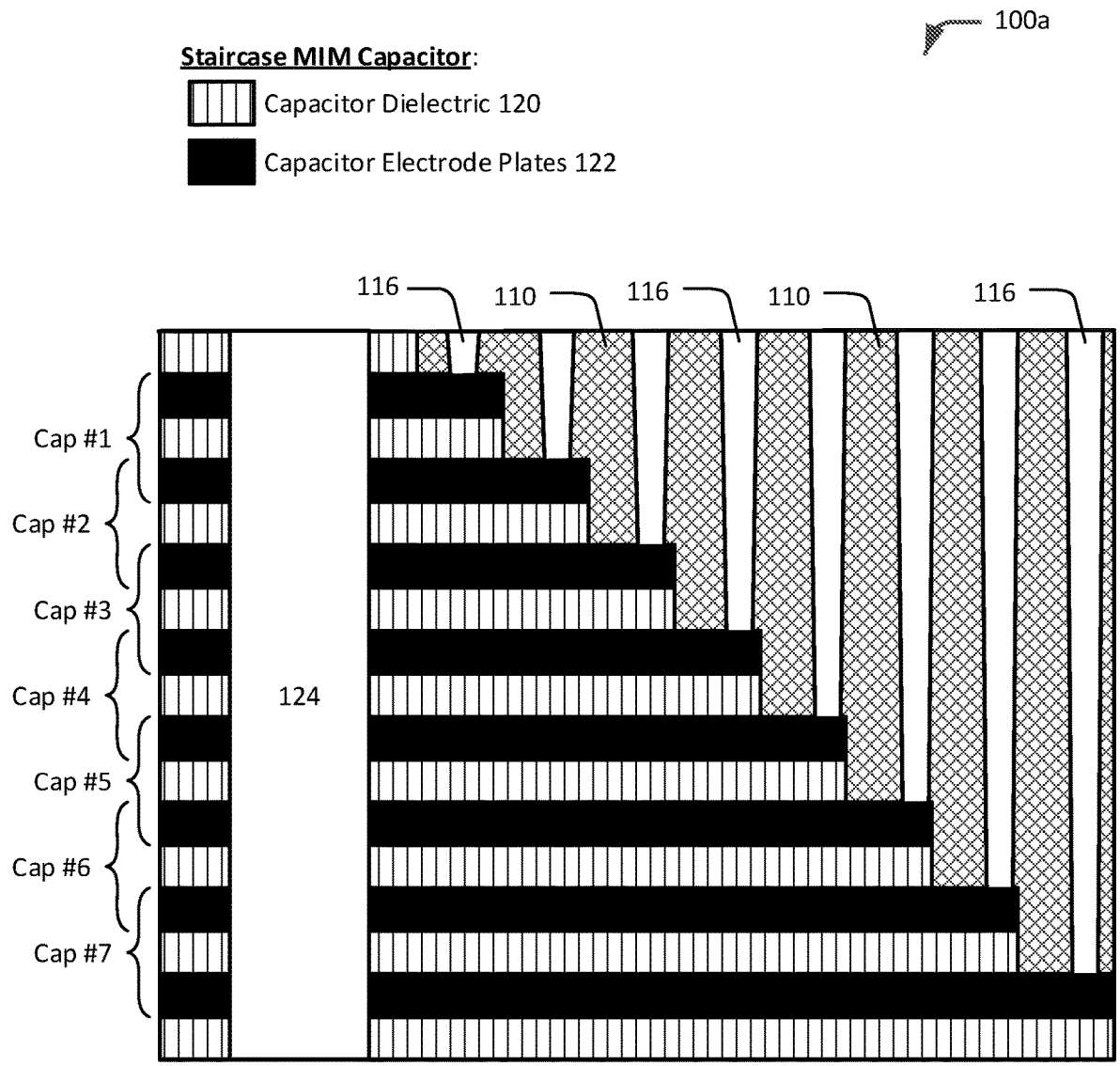
FIGS. 1A and 1B each shows an example multi-plate MIM capacitor implemented with a staircase structure, in accordance with an embodiment of the present disclosure.

Although the following Detailed Description will proceed with reference being made to illustrative embodiments, many alternatives, modifications, and variations thereof will be apparent in light of this disclosure. As will be further appreciated, the figures are not necessarily drawn to scale or intended to limit the present disclosure to the specific configurations shown. For instance, while some figures generally indicate perfectly straight lines, right angles, and smooth surfaces, an actual implementation of an integrated circuit structure may have less than perfect straight lines, right angles (e.g., tapered sidewalls and rounded corners), and some features may have surface topology or otherwise be non-smooth, given real world limitations of the processing equipment and techniques used.

DETAILED DESCRIPTION

Multi-plate MIM capacitors are disclosed herein. The capacitors include a staircase-like structure and may be formed using fewer deposition and patterning processes, relative to traditional multi-plate MIM capacitor forming processes. In an example, an integrated circuit includes a staircase structure that includes a number of steps. Each of these steps (or a subset thereof) generally includes a high-k dielectric material layer (capacitor dielectric) and one or more conductive material layers (electrode plates of the multi-plate capacitor). An insulator fill material is provided over the staircase structure. Each step may have a contact that lands on the electrode plate of that step, with the contact passing through the insulator fill material to reach that step. A recess passes through the staircase structure. The content of the recess and the step configuration can vary. For example, in some example cases, the recess is filled with insulator material. In such cases, each step of the staircase structure effectively has a bilayer structure that includes a lower layer of capacitor dielectric material (high-k dielectric material) and an upper layer of capacitor electrode material (conductive material layer). In another example case, the recess is filled with conductive material, and provides a common electrode plate of the multi-plate capacitor. In such cases, each step of the staircase structure effectively has a multilayer structure that includes an upper portion and a lower portion. The upper portion includes a layer of capacitor dielectric material (high-k dielectric material) between first and second layers of capacitor electrode material (conductive material layer). The second layers of capacitor electrode material are continuous with, or otherwise in contact with, the conductive material in the recess. The lower portion of a given step includes a layer of insulator material, which isolates one step from the next. In some cases, the multi-plate MIM capacitor may be integrated into the backend interconnect structure. Numerous variations and embodiments will be appreciated in light of this disclosure.

General Overview

As noted above, there are a number of non-trivial issues associated with providing decoupling capacitors, particularly with respect to high power delivery efficiency in the context of scaled interconnects, due to direct current (DC) and alternating current (AC) challenges. An example DC challenge is with respect to voltage loss (IR drop) due to resistance of the interconnect, while an example AC challenge is with respect to voltage droop. To minimize the effect of such IR drop and voltage droop, larger and larger MIM capacitors can be integrated in backend metallization layers, closer to the frontend circuits. However, the larger capacitance values necessitate increased capacitance density, which in turn results in an increased number of MIM capacitor plates that are sequentially processed and hence drive to higher costs. In particular, a traditional MIM capacitor is formed with a first deposition layer including a lower capacitor plate (electrode), followed by a second deposition layer including a capacitor dielectric, followed by a third deposition layer including an upper capacitor plate (electrode). Additional layers of alternating dielectric and electrode materials can be sequentially deposited in the vertical direction to provide greater capacitance values; likewise, an electrode of a so-formed first MIM capacitor can be connected to a second so-formed MIM capacitor that is laterally adjacent to the first MIM capacitor to provide greater capacitance values. Such multi-plate MIM caps are expensive from a process point of view (e.g., each plate is a separate process). Another option is to use a single pair of plates (electrodes) with a higher-k dielectric. However, higher-k dielectrics typically have lower band-gap and hence higher leakage.

Thus, techniques are provided herein that enable relatively low-cost high density multi-plate MIM capacitors. The techniques employ a staircase structure and may use fewer deposition and patterning processes, relative to traditional multi-plate MIM capacitor forming processes. For instance, depending on the multi-plate MIM capacitor being formed, a staircase-based remove-and-replace methodology includes two or three deposition processes to form the electrode plates and dielectric of the multi-plate MIM structure. Any number of electrode metals and high-k dielectric materials can be used. In an example embodiment, an integrated circuit includes a staircase structure that includes a number of usable steps. Note that the usable steps may include, for instance, all steps of the staircase, or all steps except the topmost and/or bottommost steps, or some other subset of the steps; further note that not all steps of a given staircase structure need be used. Each of the used steps generally includes a high-k dielectric material layer and one or more conductive material layers. The conductive material layers provide the electrode plates of the multi-plate capacitor. An insulator fill material is provided over the staircase structure. Each step may have a contact that lands on the electrode plate of that step, with the contact passing through the insulator fill material to reach that step. A recess passes through the steps of the staircase structure. The content of the recess and the step configuration can vary.

For example, in some example cases, the recess is filled with insulator material. In such cases, each usable step of the staircase structure effectively has a bilayer structure that includes a lower layer of capacitor dielectric material (high-k dielectric material) and an upper layer of capacitor electrode material (conductive material layer). Note in such cases that each step of the staircase structure provides one electrode plate of the multi-plate MIM capacitor. In another example case, the recess is filled with conductive material, and provides a common electrode plate of the multi-plate capacitor. In such cases, each usable step of the staircase structure effectively has a multilayer structure that includes an upper portion and a lower portion. The upper portion includes a layer of capacitor dielectric material (high-k dielectric material) between first and second layers of capacitor electrode material (conductive material layer). The second layers of capacitor electrode material are continuous with, or otherwise in contact with, the conductive material in the recess. The lower portion of a given step includes a layer of insulator material, which isolates one step from the next.

In some cases, the multi-plate MIM capacitor may be integrated into the backend interconnect structure. In such cases where the recess is filled with dielectric material, the integrated circuit may further include, for instance, a first conductive interconnect feature that is in contact with one or more of some of the contacts, and a second conductive interconnect feature that is in contact with one or more of the remaining contacts. In other such cases where the recess is filled with conductive material, the integrated circuit includes a first conductive interconnect feature that is in contact with one or more of the contacts, and a second conductive interconnect feature that is in contact with the conductive material in the recess. In any such cases, the first conductive interconnect feature may be, for example, in contact with a power rail, and the second conductive interconnect feature is in contact with a ground plane, so as to provide a multi-plate MIM decoupling capacitor.

In some example embodiments, the integrated circuit structure includes an etch stop on the staircase structure, and the contacts also pass through the etch stop to land on their respective steps. In some such cases, the etch stop includes a high-k dielectric material. Note that the high-k dielectric material of the etch stop may be, or not, elementally distinct from the high-k dielectric material of the multi-plate MIM capacitor. The etch stop can be used, for example, to prevent non-uniform etching of the conductive material layers (electrode plates) underlying the etch stop. In some such embodiments, the etch stop is a single layer that is composed of a material having high etch selectivity with respect to the given insulator fill material. In other embodiments, the etch stop is a bilayer or multi-layer structure that includes a first layer and a second layer of materials having high etch selectivity with respect to the given insulator fill material. In some example embodiments, the etch stop includes at least one layer of high-k dielectric (e.g., hafnium oxide or other high-k oxide). In general, the slower etch rate of the etch stop effectively protects the conductive material layers (electrode plates) located higher in the staircase structure from being etched or otherwise penetrated during the contact etching process to reach the conductive layers located lower in the staircase structure. Further note that the non-conductive nature of the etch stop eliminates any shorting risk between electrode plates.

In some cases, the staircase structure is initially formed from a multilayer stack of alternating first and second insulator layers that are etch selective with respect to one another (such as alternating layer of oxide and nitride materials). The staircase structure is formed from the multilayer stack, and a recess is etched into the structure, which provides access to the first and second insulator layers, one or both of which are sacrificial. In one example case, a multi-plate MIM capacitor is formed by selectively removing the first insulator layers from the multilayer stack and depositing the high-k dielectric material (capacitor dielectric) in place of those first insulator layers, and selectively removing the second insulator layers from the multilayer stack and depositing the conductive material (capacitor electrode plates) in place of those second insulator layers. In another example case, a multi-plate MIM capacitor is formed by selectively removing the second insulator layers from the multilayer stack and replacing those layers with three conformal depositions. In particular, a first conformal deposition of conductive material (capacitor electrode plates) is provided via the recess and excess conductive material is removed from sidewalls and bottom of the recess; a second conformal deposition of high-k dielectric material (capacitor dielectric) is provided via the recess over the first conformal deposition of conductive material and on sidewalls and bottom of the recess; a third conformal deposition of conductive material (a common capacitor electrode plate) is provided via the recess and fills the recess.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some example embodiments, such tools may indicate the presence of a staircase-based multi-plate MIM capacitor structure (e.g., by way of a TEM cross-section image) within one or more layers of the backend interconnect structure.

Materials that are compositionally distinct or different as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., boron, silicon, gallium, and magnesium) or the same dopants but at differing concentrations. In still other embodiments, compositionally different may further refer to two materials that have different crystallographic orientations. For instance, (110) silicon is different from (100) silicon. Creating a stack of different orientations could be accomplished, for instance, with blanket wafer layer transfer. If two materials are elementally distinct or different, then one of the material has an element that is not in the other material.

It is noted that designations such above or below or top or bottom or top side or bottom side are not intended to necessarily implicate a limitation as to orientation of the embodiments described herein. Rather, such terminology is simply used in a relative sense to consistently describe a structure as it exists in any one particular orientation and as illustrated herein.

As used herein, the term layer refers to a material portion including a region with a thickness. A monolayer is a layer that consists of a single layer of atoms of a given material. A layer can extend over the entirety of an underlying or overlying structure, and may have an extent less than the extent of an underlying or overlying structure. A layer can extend horizontally, vertically, and/or along a tapered or non-linear surface. A layer can be conformal to a given surface (whether flat or curvilinear) with a relatively uniform thickness across the entire layer, but need not be conformal or otherwise uniform. A single layer may have a graded component or multiple phases, such that the layer is not homogenous.

Architecture

FIG. 1A shows an example multi-plate MIM capacitor 100a implemented with a staircase structure, in accordance with an embodiment of the present disclosure. As can be seen, the staircase structure includes a number of steps each including a bilayer structure. A lower portion of the bilayer structure includes dielectric material 120 suitable for providing the capacitor dielectric of capacitor 100a, and an upper portion of the bilayer structure includes conductive material 122 suitable for providing an electrode plate of capacitor 100a. A recess passes through steps of the staircase structure and is filled with dielectric material 124. As can be further seen, a number of contacts 116 pass through insulator fill material 110 to land on the electrode plate of a respective one of the steps. Contacts 116 can be connected into a given integrated circuit to provide a relatively high capacitance. In one such example case, and assuming contacts are numbered 1 through 8 from left to right, a first interconnect conductor connects to the odd numbered contacts 116, and a second interconnect conductor connects to the even numbered contacts 116, so as to provide seven capacitors in parallel between the first and second interconnect conductors. Other connection schemes can be used as well, as will be appreciated. Note that not all of the capacitors need to be included in a given connection scheme. Further note that one or more of the available capacitors may be connected to provide a first capacitor function (e.g., decoupling capacitor for power supply) and one or more of the remaining available capacitors may be connected to provide a second capacitor function (e.g., integration capacitor). Some connection schemes may allow for selectively connecting (or disconnecting, as the case may be) the capacitors on an as needed basis, for a given application (capacitance tuning).

Insulator fill material 110 can be any number of insulator materials (e.g., oxides, nitrides, carbides), such as silicon dioxide, silicon oxycarbonitride, silicon oxycarbide, or silicon nitride, to name a few examples. Contacts 116 can be any number of contact materials, such as tungsten, ruthenium, copper, aluminum, silver, gold, titanium, molybdenum, or alloys including any of these metals, to name a few examples. In a more general sense, insulator fill material 110 and contacts 116 can be any suitable materials and the present disclosure is not intended to be limited to any particular such materials, as will be appreciated.

Capacitor dielectric 120 can be any number of high-k dielectric materials. As used herein, the term high-k dielectric refers to materials having a dielectric constant greater than that of silicon dioxide (a k value greater than approximately 3.9). Examples of high-k dielectric materials include, for instance, hafnium oxide, hafnium silicon oxide, zirconium oxide, zirconium silicon oxide, lanthanum oxide, hafnium aluminum oxide, hafnium zirconium oxide, lanthanum aluminum oxide, and titanium oxide, tantalum oxide, barium strontium titanium oxide, barium titanium oxide, strontium titanium oxide, yttrium oxide, aluminum oxide, lead scandium tantalum oxide, and lead zinc niobite. Moreover, note the stoichiometry of such high-k dielectric compounds may vary from one embodiment to the next, and such compounds represented without stoichiometric coefficients or values are intended to represent all forms of that high-k dielectric compound.

Capacitor electrode plates 122 can be any number of conductive electrode plate materials, such as tungsten, ruthenium, molybdenum, titanium, tantalum, titanium-tantalum, titanium nitride, tantalum nitride, and titanium-tantalum nitride, to name a few examples. In a more general sense, dielectric 120 and electrode plates 122 can be any suitable materials and the present disclosure is not intended to be limited to any particular such materials, as will be appreciated.

Insulator material 124 can be any number of suitable insulator materials. In some embodiments, insulator material 124 is the same as insulator fill material 110, but they need not be the same. In a more general sense, dielectric 124 can be any suitable insulator material and the present disclosure is not intended to be limited to any particular such materials, as will be appreciated.

Figure 1B:
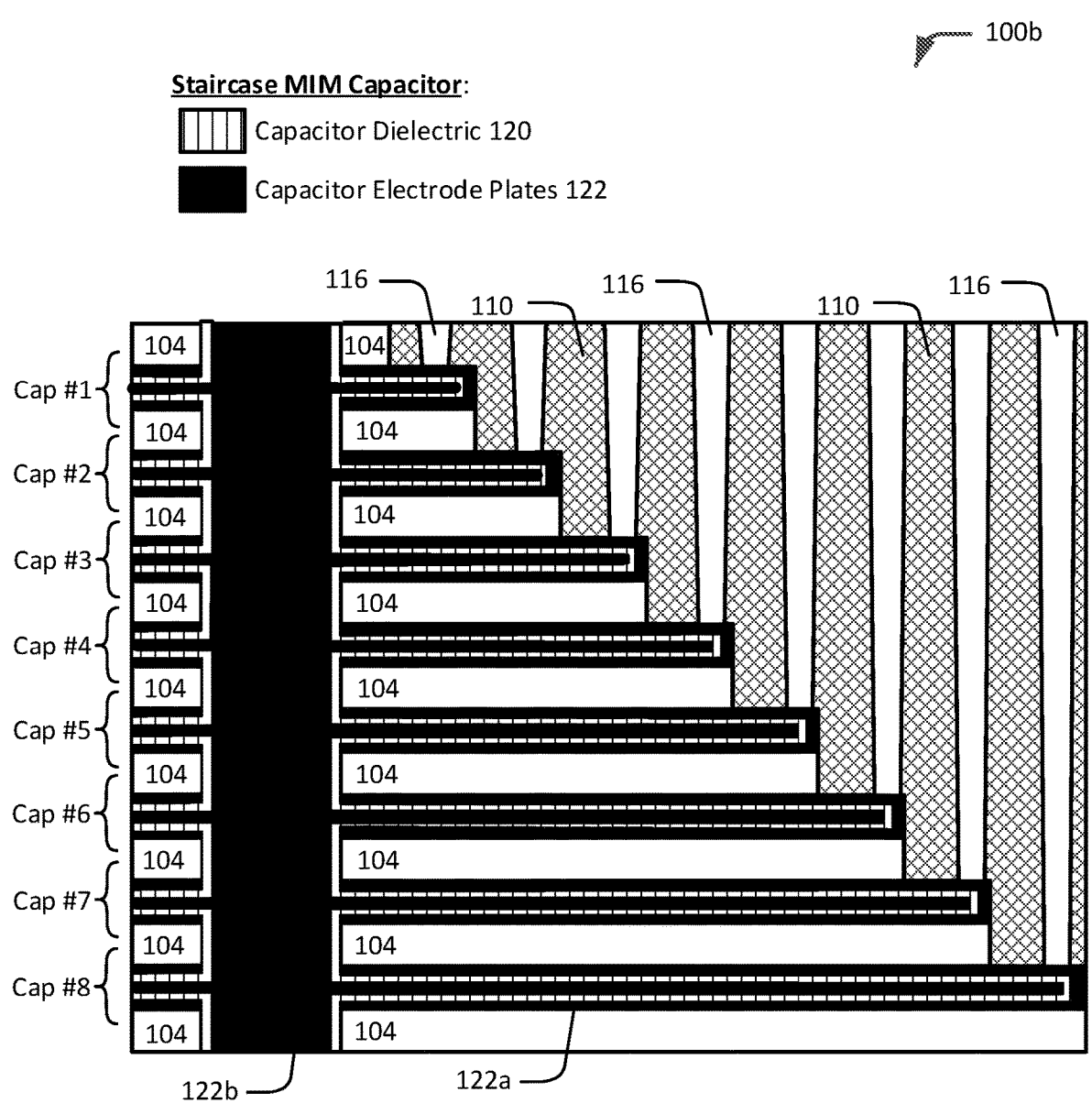

FIG. 1B shows an example multi-plate MIM capacitor 100b implemented with a staircase structure, in accordance with another embodiment of the present disclosure. As can be seen, the staircase structure includes a number of steps each generally including an upper portion and a lower portion. In addition, a recess filled with conductive material 122b passes through steps of the staircase structure. The lower portion of a given step includes a layer of insulator material 104, which isolates one step from the next. As can be further seen, the upper portion of a given step includes capacitor structure that includes a layer of capacitor dielectric 120 between first and second capacitor electrode plates 122a and 122b, respectively. Note that the second capacitor electrode plates 122b that extend along each of the steps are continuous with, or otherwise in contact with, the conductive material 122b.

The previous discussion with respect to fill material 110 and contacts 116 is equally applicable here, as is the previous discussion with respect to materials for dielectric 120 and electrode plates 122. Layer 104 can be any number of insulator materials, such as an oxide, nitride, carbide, oxynitride, oxycarbide, or oxycarbonitride. In some cases, layer 104 includes the same insulator material as insulator fill 110 (e.g., silicon dioxide), but they need not be the same.

Just as with structure 100a, the contacts 116 of structure 100b can be connected into a given integrated circuit to provide a relatively high capacitance. In one such example case, a first interconnect conductor connects to the common electrode plate 122b, and a second interconnect conductor connects to one or more of the eight contacts 116, so as to provide up to eight capacitors in parallel between the first and second interconnect conductors. Other connection schemes can be used as well, as will be appreciated. Note that not all of the capacitors need to be included in a given connection scheme. Further note that one or more of the available capacitors may be connected to provide a first capacitor function (e.g., decoupling capacitor for +V power supply) and one or more of the remaining available capacitors may be connected to provide a second capacitor function (e.g., decoupling capacitor for −V power supply). Again, just was with structure 100a, some connection schemes may allow for selectively connecting (or disconnecting, as the case may be) the capacitors on an as needed basis, for a given application (capacitance tuning).

Figure 2:
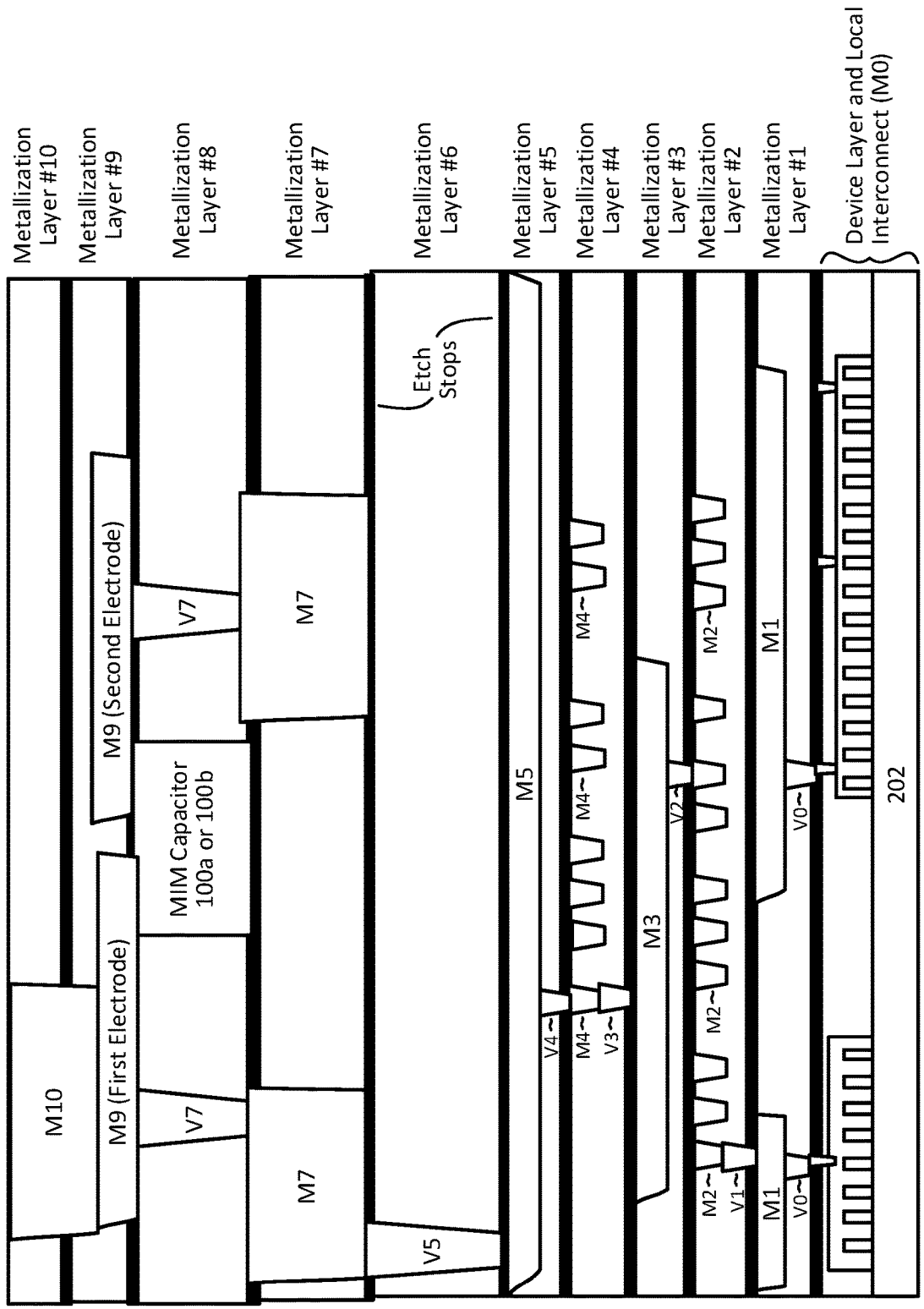
FIG. 2 shows an example integrated circuit that includes a multi-plate MIM capacitor implemented with a staircase structure, in accordance with an embodiment of the present disclosure.

FIG. 2 shows an example integrated circuit that includes a multi-plate MIM capacitor 100a or 100b, in accordance with some embodiments of the present disclosure. As can be seen, the integrated circuit includes a device layer 202 configured with or otherwise including a plurality of transistor devices (e.g., metal oxide semiconductor field effect transistors, MOSFETs). An interconnect structure including a number of interconnect layers (metallization layers #1 through #10, in this example case) is above device layer 202. Each interconnect layer is separated from the previous interconnect layer by an etch stop (e.g., nitride, oxynitride, oxycarbonitride), and may include any number of interconnect features vias and conductive lines (e.g., copper, aluminum, tungsten) and patterning to facilitate signal routing for a given integrated circuit.

In this example case, layer #1 includes vias V0 that couple the local interconnect (M0) of device layer 202 to respective metal lines M1; layer #2 includes via V1 and metal lines M2, with V1 connecting an M1 to an M2; layer #3 includes via V2 and metal line M3, with V2 connecting an M2 to M3; layer #4 includes via V3 and metal lines M4, with V3 connecting M3 to an M4; layer #5 includes via V4 and metal line M5, with V4 connecting an M4 to M5; layer #6 includes deep via V5, which connects M5 to a metal line M7 of layer #7, which in this example includes two metal lines M7; layer #8 includes a first deep via V7 that connects a first M7 to a first metal line M9 of layer #9, a second deep via V7 that connects a second M7 (e.g., ground plane) to a second metal line M9 of layer #9, and a MIM capacitor 100a or 100b, with the first and second metal lines M9 of layer #9 coupled to or otherwise effectively providing first and second electrodes of capacitor 100a or 100b; and layer #10 includes metal line M10 (e.g., power rail), which is connected to the first M9.

Other interconnect structures may include fewer interconnect layers or more interconnect layers. Further note that capacitor 100a or 100b is contained in a single interconnect layer (layer #8 in this example), but in other example cases may extend into multiple interconnect layers. Further note that in this example, capacitor 100a or 100b is being used as a decoupling capacitor connected between a power rail (M10, such as $V_{CC}$, $V_{DD}$, $V_{SS}$) and ground (second M7), but other capacitor applications may equally benefit from use of capacitor 100a or 100b. In one example case, multi-plate MIM capacitor 100a of FIG. 1A is used, wherein the first (left) M9 is connected to the odd numbered contacts 116 (e.g., 1, 3, 5, and 7) and the second (right) M9 is connected to the even numbered contacts 116 (e.g., 2, 4, 6, and 8). In another example case, multi-plate MIM capacitor 100b of FIG. 1B is used, wherein the first M9 is on or otherwise connected to electrode plate 122b and the second M9 is connected to the electrode plates 122a by way of contacts 116.

Methodology

FIGS. 3A-3K' collectively illustrate cross-sectional views of example integrated circuit structures formed at different points during a process for forming a multi-plate MIM capacitor implemented with a staircase structure, in accordance with some embodiments of the present disclosure. Such a process can be used to form, for example, multi-plate MIM capacitor 100a.

Figures 3A, 3B:
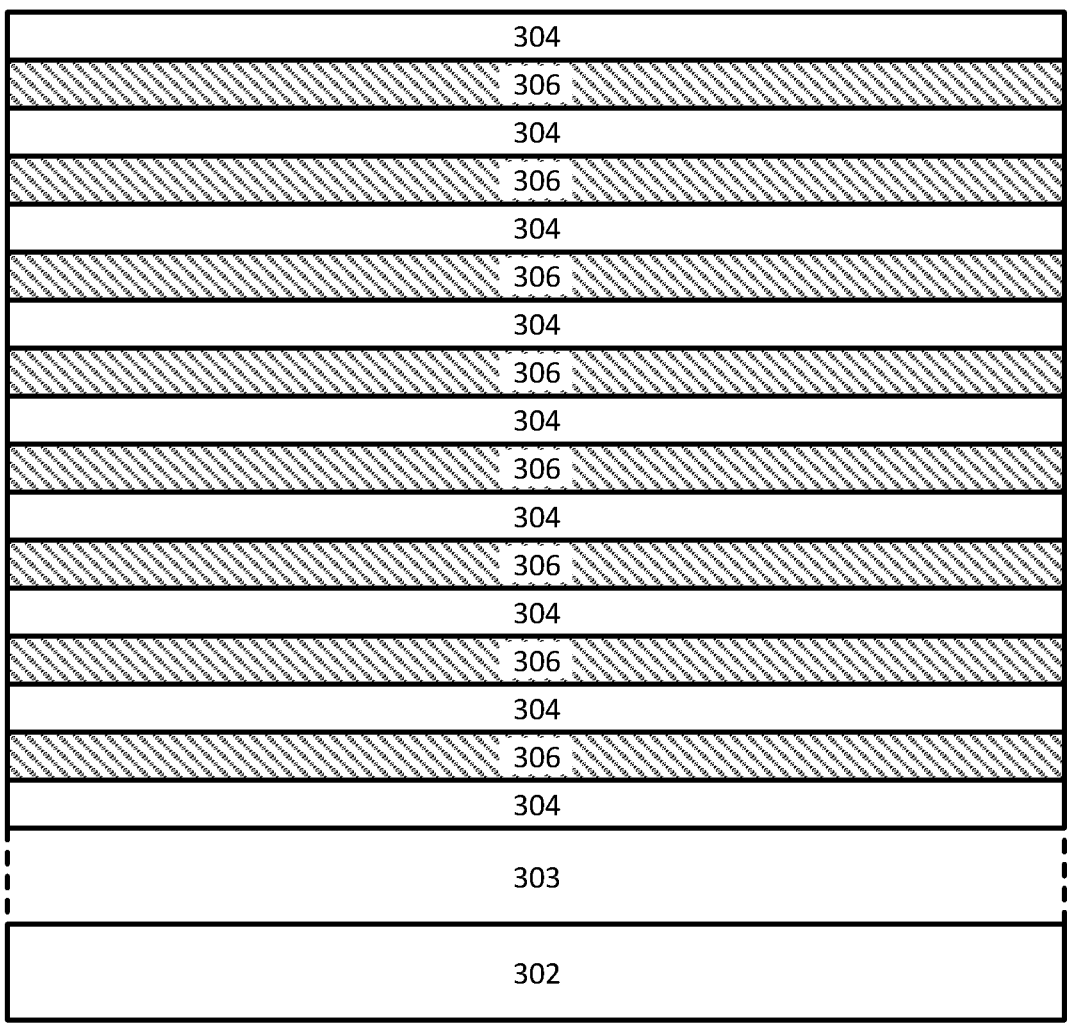
FIGS. 3A-3K' collectively illustrate cross-sectional views of example integrated circuit structures formed at different points during a process for forming a multi-plate MIM capacitor implemented with a staircase structure, in accordance with some embodiments of the present disclosure.

FIG. 3A shows an example substrate 302, in accordance with an embodiment. Any number of suitable substrates can be used here, including bulk substrates, semiconductor-on-insulator substrates (XOI, where X is a semiconductor material such as silicon, germanium, SiGe, gallium arsenide, or indium gallium arsenide), and multi-layered substrate structures. In a more general sense, any substrate upon which an integrated circuit including multi-plate MIM capacitor 100a can be formed can be used. In one specific embodiment, substrate 302 is a bulk silicon substrate.

FIG. 3B shows the resulting structure after an interconnect structure 303 is deposited on substrate 302, and after a stack of alternating layers 304 and 306 is deposited on or within the interconnect structure 303, according to an embodiment. Interconnect structure 303 may include one or more interconnect layers, such as metallization layers formed during a backend of line (BEOL) process. Such layers include, for instance, one or more conductive features within a layer of dielectric material, each interconnect layer set off from the previous one by an etch stop layer (such as shown in FIG. 2). Note that additional interconnect layers may be formed above the stack of alternating layers 304 and 306. As previously explained, the stack of alternating layers 304 and 306 may be within one or more interconnect layers of structure 303. In other embodiments, the stack of alternating layers 304 and 306 can be formed directly over substrate, without an intervening interconnect structure 303.

In some cases, layers 304 and 306 are first and second insulator materials that are etch selective with respect to one another. For instance, layers 304 can be oxide layers (e.g., silicon dioxide) and layer 306 can be nitride layers (e.g., silicon nitride), or vice-versa. Alternatively, layers 304 can be nitride layers (e.g., silicon nitride) and layer 306 can be carbide layers (e.g., silicon carbide), or vice-versa. Alternatively, layers 304 can be nitride layers (e.g., silicon carbide) and layer 306 can be carbide layers (e.g., silicon dioxide), or vice-versa. In a more general sense, layers 304 and 306 can be any two materials that are etch selective, regardless of whether those materials are conductive, insulative, and/or semiconductive. In any such cases, layers 304 and 306 can be sequentially deposited using any suitable deposition technique, such as atomic layer deposition (ALD), chemical vapor deposition (CVD), and/or physical vapor deposition (PVD).

Each layer 304 in the stack can have the same thickness or have different thicknesses. For example, in some embodiments, each layer 304 has a thickness in the range of about 10 nm to about 100 nm. In one specific such embodiment, each oxide layer 304 has a thickness of about 20 nm to 50 nm (e.g., 35 nm). Similarly, each layer 306 in the stack can have the same thickness or have different thicknesses. For example, in some embodiments, each layer 306 has a thickness in the range of about 10 nm to about 100 nm. In one specific such embodiment, each layer 306 has a thickness of about 20 nm to 50 nm (e.g., 35 nm). In a more general sense, the thickness of the layers 304 and 306 can vary greatly. The stack can include any number of alternating layers of 304 and 306. For example, in some specific example embodiments, the stack includes between 4 and 100 or so layers (or 2 to 50 layer pairs 304/306). In a more general sense, the number of alternating layers in the stack can vary greatly, depending on the particulars of the multi-plate capacitor being formed, and the techniques provided herein can be used to the benefit of any such configurations.

Figure 3C:
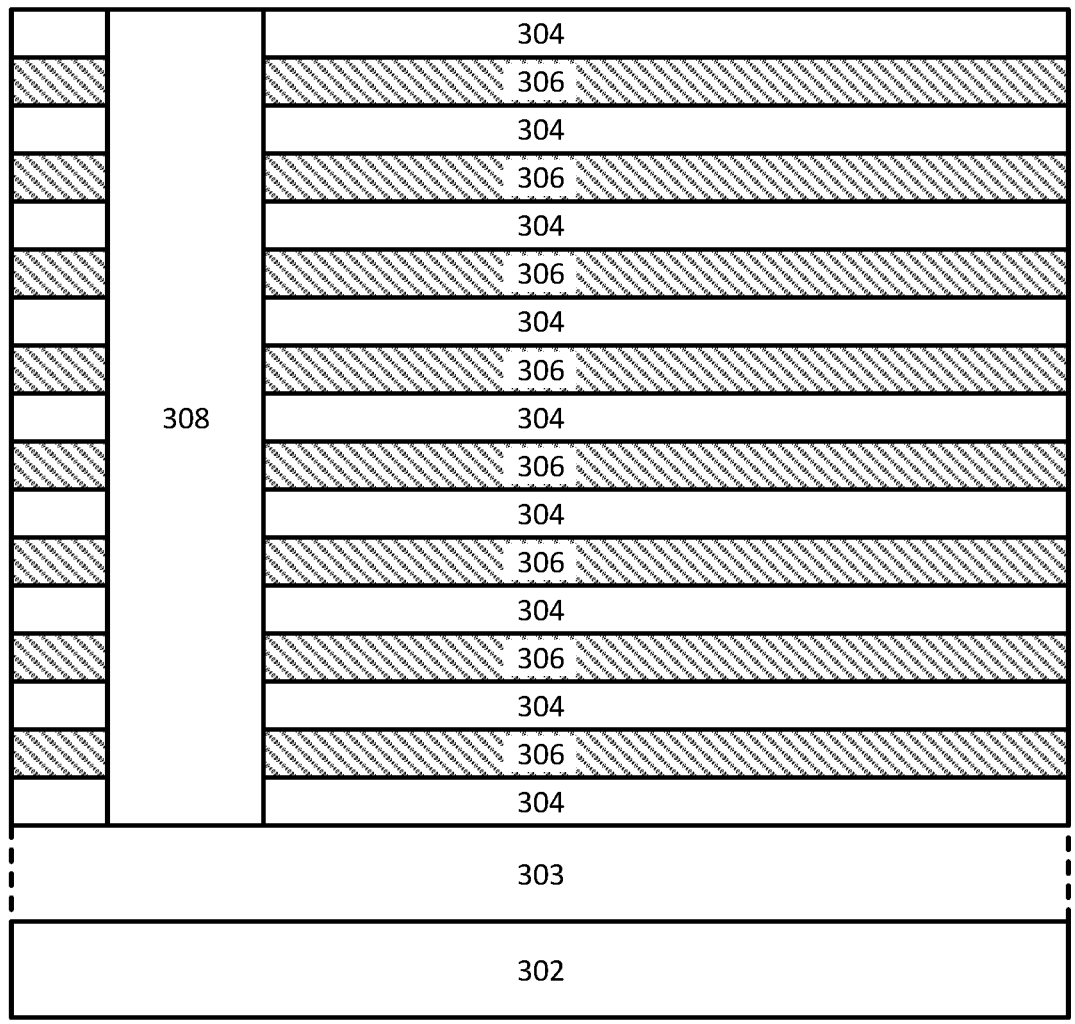

FIG. 3C illustrates the structure of FIG. 3b after a recess has been patterned, etched and filled with material 308, in accordance with an embodiment of the present disclosure. The recess can be formed, for example, using standard lithography techniques, such as patterning a mask that defines the opening of the recess and then etching (e.g., isotropic etch) down through the steps of the staircase. In this example case, the etch extends down through the entire stack, to the interconnect structure 303. In other cases, the recess only extends down to the lowest step intended for use. As will be explained in turn, the trench provides access to sacrificial material(s) 304 and/or 306, so that can be removed and replaced with one or more MIM capacitor layers. Material 308 can be any number of fill materials (e.g., oxides, nitrides, carbides), but in some embodiments is a nitride, oxynitride or oxycarbonitride, so as to be etch selective with respect any exposed oxide layers (e.g., 304, 310).

Figure 3D:
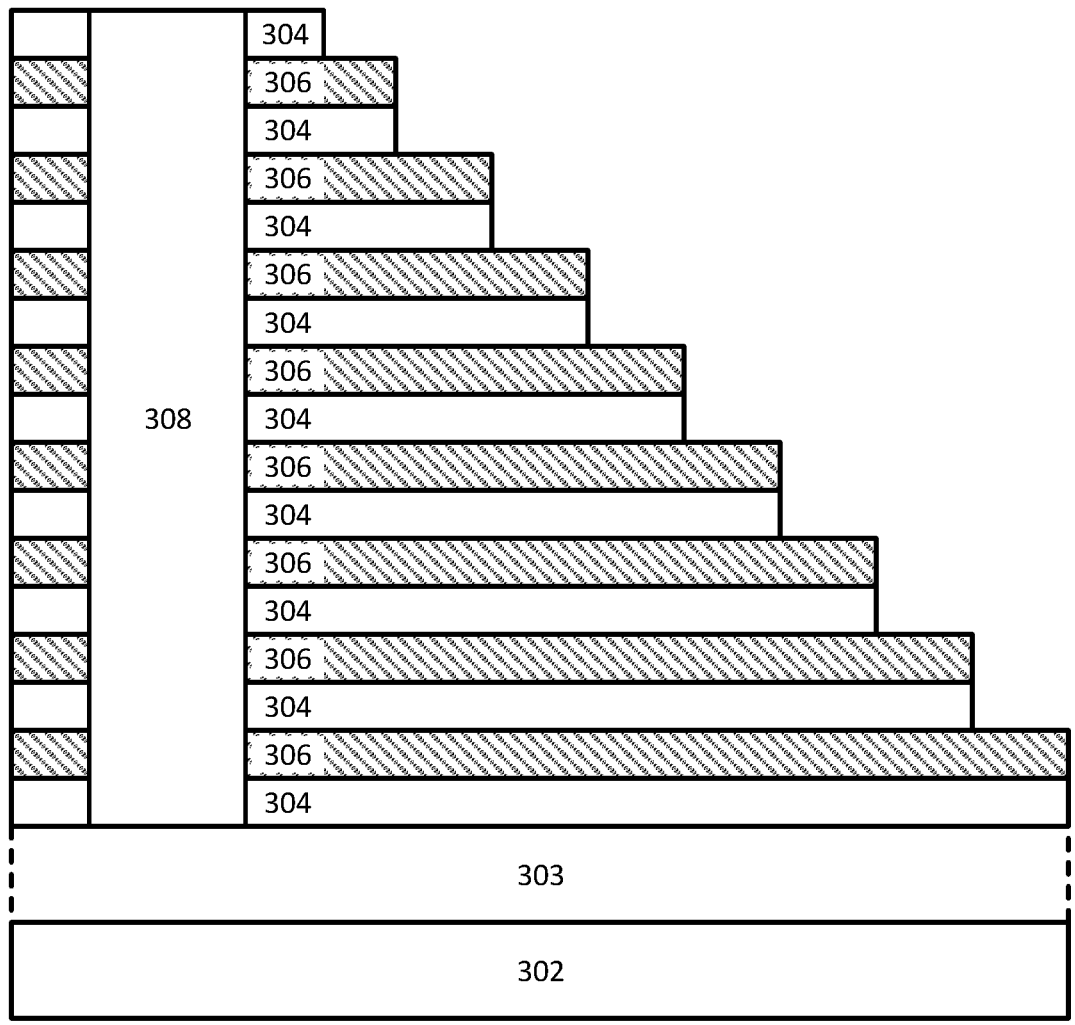

FIG. 3D shows the structure of FIG. 3C after a staircase structure has been formed in the stack of alternating layers, in accordance with an embodiment. A staircase structure generally includes two or more steps, where the riser of at least some of the steps includes a first layer 304 and a second layer 306. Note that in this example embodiment, the top layer of each step in the staircase structure is a layer 306, but in other embodiments the top layer of each step can be a layer 304. So, in some example embodiments having 4 to 20 layers in the stack, the resulting staircase structure includes between 2 and 10 steps (e.g., 8 steps). In a more general sense, the staircase can be configured with any number of steps, depending on the particulars of the given memory application. Note in this example that the topmost layer 304 is a partial step and thus not a usable step. Such a step can be removed, for instance, via a chemical mechanical planarization (CMP) process, in some cases.

The staircase structure can be formed with standard staircase etch processing, or any other suitable etch process. For example, in one embodiment, a hardmask is provisioned over the stack of alternating layers 304 and 306. The hardmask is then photographically patterned and etched to the depth of a single step, and the riser including topmost layer 306 and layer 304 is exposed. The hardmask is then etched sideways (sometimes called a pull-back etch) to the tread width of the next step, and the next pair of layers 306 and 304 are etched to the depth of a single step, and the riser of that next step is formed. This process is repeated for each step of the staircase, until the staircase is formed. Although the example staircase structure of FIG. 3D shows eight full steps, any number of steps can be provisioned, as previously explained.

Figure 3E:
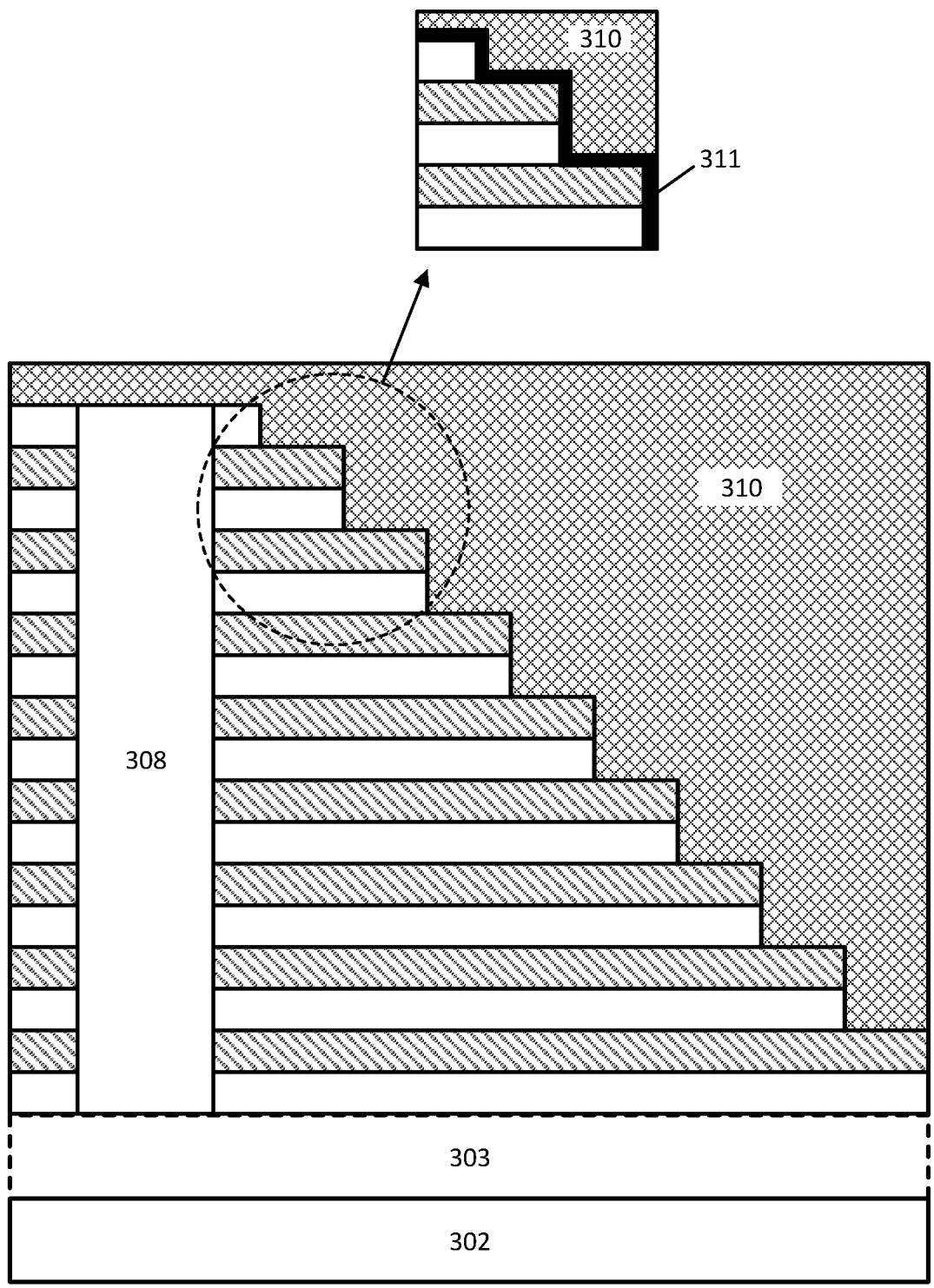

FIG. 3E shows the structure of FIG. 3D after an insulator fill material 310 is deposited over the staircase structure, in accordance with an embodiment. As can be further seen in the alternative embodiment, a conformal etch stop 311 may be deposited on the staircase structure before the insulator fill material 310. The insulator fill material 310 is selectively etchable with respect to the etch stop 311, and in some embodiments is an oxide or porous oxide (e.g., silicon dioxide or porous silicon dioxide). So, for example, for a given etch chemistry, an etch stop 311 that includes high-k dielectric material(s), and optionally further includes materials such as nitrides and oxynitrides, will etch relatively much slower (e.g., more than 15 times slower) than an insulator fill material 310 that is composed of an oxide. Insulator fill 310 can be deposited using any suitable deposition technique, such as ALD, CVD, PVD, or a combination of such techniques. In one specific embodiment, insulator fill 310 is deposited using PVD. Any excess insulator fill 310 can be removed, for instance, with a CMP process that planarizes the structure to a desired height (such as 50 nm to 500 nm above the top step of the staircase, or to the top of the staircase). Note that, in some example embodiments, insulator fill 310 can be the same composition as oxide layers 304 in the staircase structure, but it need not be. Because the staircase structure itself provides a relatively high amount of structural integrity, the insulator fill 310 can be porous to improve its etchability with to the etch stop 311, as will be appreciated.

Recall etch stop 311, if present, can have a number of configurations, and may be one or more layers and/or phases (e.g., single layer, single phase; single layer, multi-phase; multi-layer, single phase; and multi-layer, multi-phase). The etch stop can be formed, for example, by conformally depositing (e.g., ALD, CVD) a non-conductive high-k dielectric material that has high etch selectivity with respect to the fill insulator material 310. In some such embodiments, the high-k dielectric material of the etch stop is annealed to further improve its etch selectivity.

In some examples, the etch stop 311 is a single layer structure that includes a high-k dielectric material, such as those previously provided herein (e.g., hafnium oxide, aluminum oxide, zirconium oxide, or yttrium oxide). One such embodiment is a single layer having a single continuous phase. Another such embodiment is a single layer having a single continuous layer that begins with a first phase A that transitions to a second phase B. One such example case is a single continuous layer etch stop 311 that includes a first phase A of silicon dioxide that transitions to a second phase B of hafnium silicon oxide. Another example such case is a single continuous layer etch stop 311 that includes a first phase A of aluminum oxide that transitions to a second phase B of lanthanum aluminum oxide. Note that one or more phases of the single continuous layer may include a high-k dielectric material, but they need not all include a high-k dielectric. In any such cases, the transition from phase A to phase B can be relatively gradual (or not, such as a step function).

In other embodiments, the etch stop 311 structure may include multiple layers. For instance, in one example case, the etch stop 311 includes a bilayer structure composed of two compositionally different layers. In one such example case, a first layer (on the staircase) includes a high-k dielectric material such as aluminum oxide, hafnium oxide, zirconium oxide, or other high-k material(s), and a second layer (on the first layer) includes silicon nitride, silicon oxynitride, or silicon oxide. In such a case, the second layer effectively allows for a first delay period before the high-k material of the first layer is reached, which effectively allows for a second longer delay period. Just as with the delay(s) associated with a single continuous layer, these delays can be factored into the overall timing of the etch process to ensure that the high-k material of the first layer is not fully consumed at any point in time during the overall etch process. In still other embodiments, the etch stop 311 may include first layer (on staircase) containing high-k dielectric material (e.g., aluminum oxide, hafnium oxide, zirconium oxide), and a second layer that has a first outer phase that gradually transitions to a second inner phase that is on the first layer (e.g., a first phase of silicon oxide that gradually transitions to a second phase of silicon oxynitride that is on the high-k dielectric material of the first layer). As previously explained, in such a case, the etchant will first encounter the outer silicon oxide phase and may consume that material in a relatively quick manner (particularly if the fill insulator 310 is also silicon oxide), but then the etch rate will slow as the nitrogen content of the silicon oxynitride phase is encountered. The etch rate will slow even further when the high-k dielectric material of the first layer is encountered. Note that the layer containing the high-k material need not necessarily be on the staircase. Specifically, in an alternative embodiment the first layer or phase on the staircase may include an oxide, nitride, or oxynitride, and the second layer or phase can include the high-k dielectric material(s). In still another example, a multi-layer, multi-phase configuration is used, where each distinct layer of an etch stop 308 having a bilayer structure includes different phases. In one specific such example case, the first layer on the staircase has a first phase of aluminum oxide that gradually transitions to a second phase of lanthanum aluminum oxide or hafnium oxide, and the second layer has a first phase of silicon oxide (on first layer) that gradually transitions to a second phase of silicon oxynitride. As note, the overall contact etch sequence can include any number of timed etch sub-processes each associated with a particular etch rate.

The thickness of the etch stop structure 311, if present, can vary from one embodiment to the next, depending on factors such as the etch chemistry used, the etch selectivity between the insulator and etch stop materials used, and the difference in height between the treads of the uppermost and lowermost stairs in the staircase structure, according to some embodiments. Note that the difference in height between the treads of the uppermost and lowermost stairs in the staircase structure effectively defines the major spread in contact hole depths, as will be discussed in turn. Although an etch stop 311 can be used on any staircase structures, such an etch stop is particularly useful with respect to structures where the height differential between the respective contacts (116 of FIG. 3H) on the uppermost and bottommost steps is greater than 5×. For instance, in some example embodiments, the height differential between the shortest and tallest contacts 316 is about 10×, or 20×, or 30×, or 40×, or 50×, or 60×, or 70×, or 80×. The thickness of the overall etch stop 311 in some cases is in the range of 10 nm to 200 nm (e.g., 15 to 150 nm, or 25 to 125 nm, or 35 to 125 nm, or 45 to 125 nm, or 55 to 125 nm, or 65 to 125 nm, or 75 to 125 nm, or 85 to 115 nm, or 90 to 110 nm, or around 100 nm). Such example dimensions can vary from one embodiment to the next.

Figure 3F:
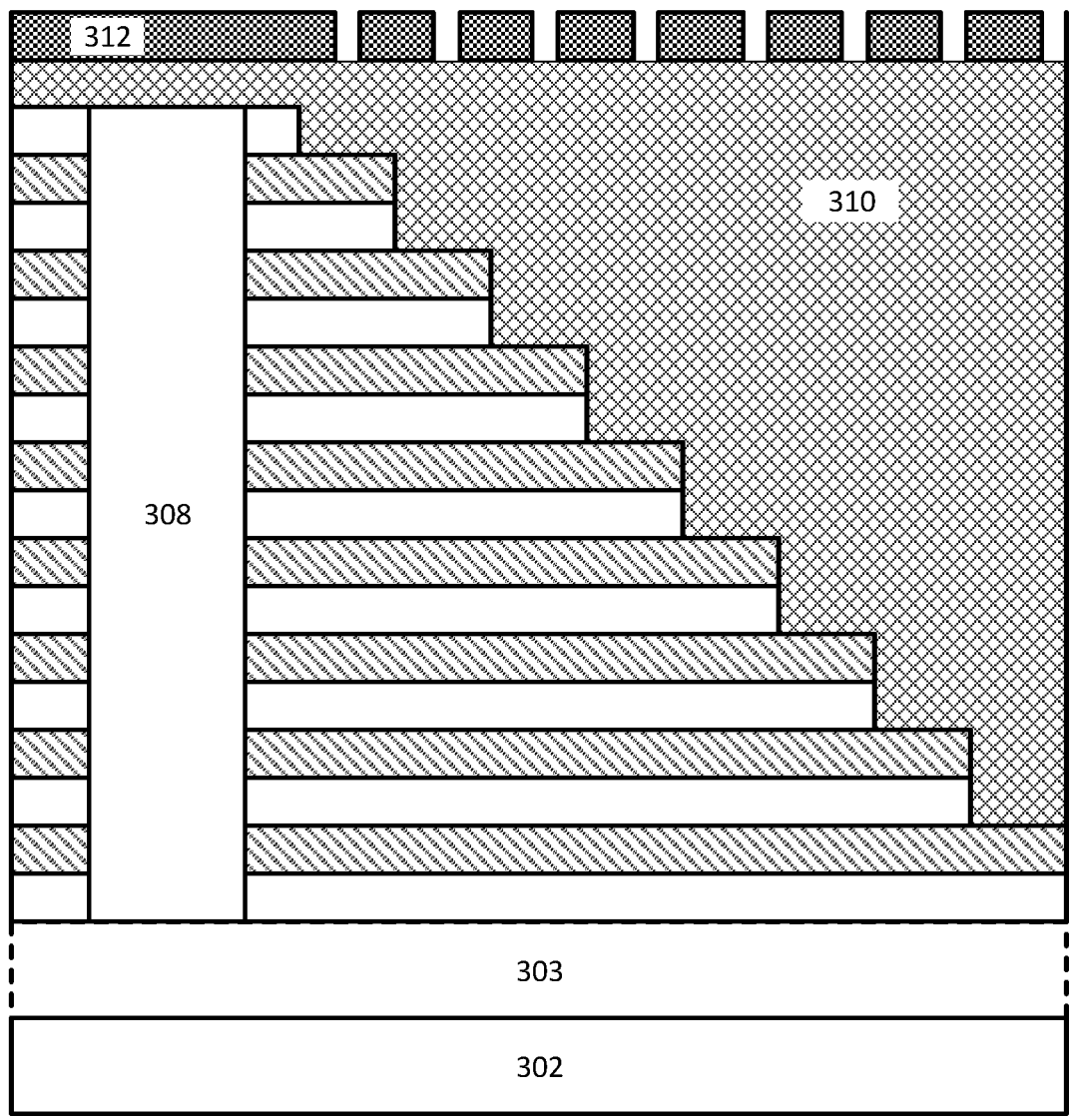
Figure 3G:
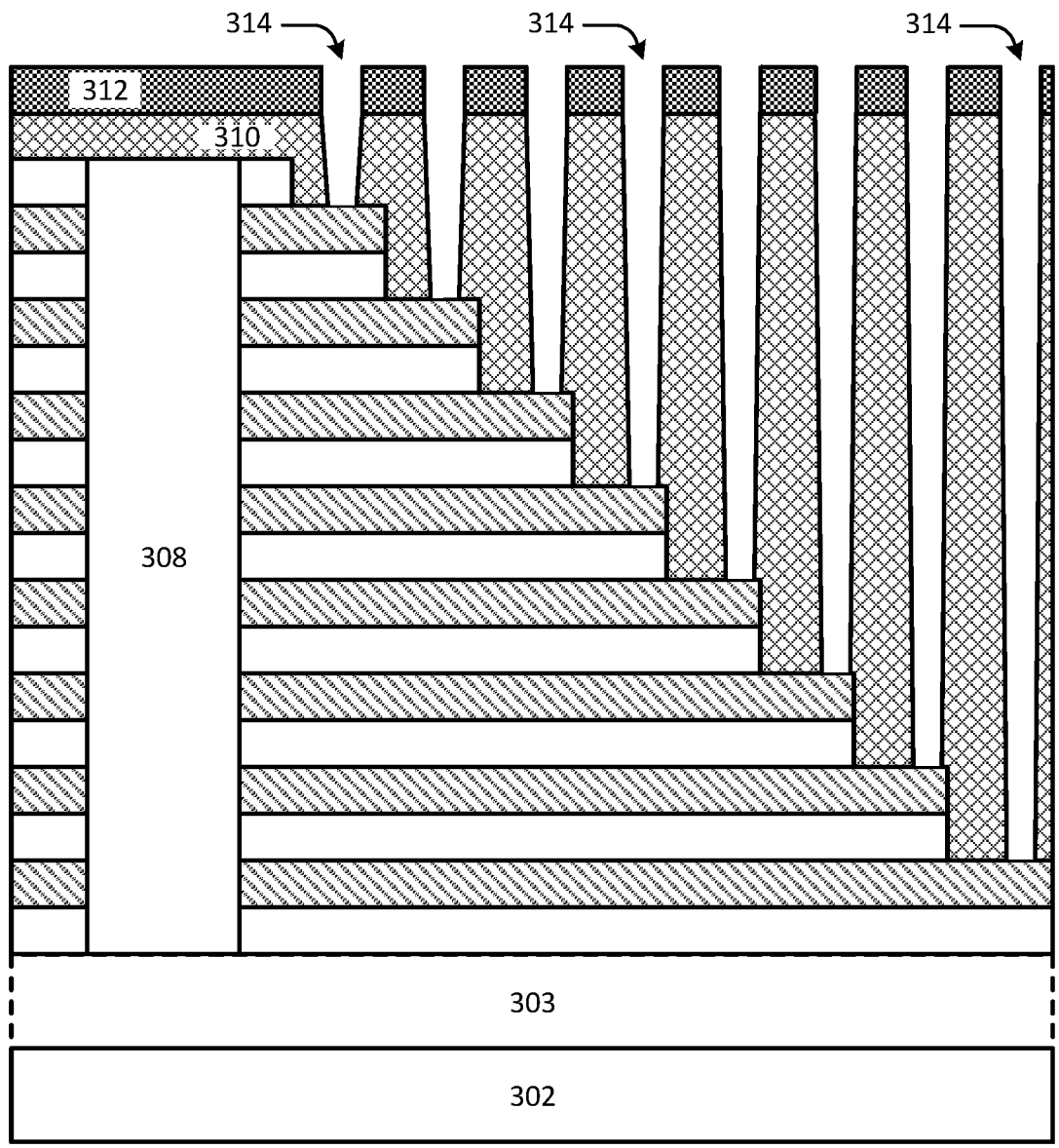

FIGS. 3F and 3G show the structure of FIG. 3E after contact holes 314 have been patterned (3F) and etched (3G), with each hole landing on a corresponding step of the staircase, according to an embodiment. As can be seen, a hardmask 312 for etching the holes is patterned and etched. Hardmask 312 can be provisioned on insulator fill 310 using any number of suitable processes. For instance, in some embodiments, hardmask 312 can be provided using standard photolithography, including deposition of or more hardmask materials (e.g., such as silicon carbide, silicon dioxide, and/or silicon nitride, or other suitable hardmask materials), patterning resist on a portion of the hardmask 312 that will remain temporarily to protect an underlying region of insulator fill 310, etching to remove the unmasked (no resist) portions of hardmask 312 (e.g., using a dry etch, or other suitable hardmask removal process), and then stripping the patterned resist material, thereby leaving the patterned hardmask 312. The pattern on hardmask 312 provides the pattern for the contact holes that are to be formed. Any number of suitable mask configurations can be used.

Using the patterned hardmask 312, insulator fill 310 can then be vertically etched to form the contact holes 314, as shown in FIG. 3G. Note that if etch stop 311 is present, then each of the holes lands on etch stop 311, but does not penetrate etch stop 311, and then the etch stop 311 can be separately etched. As previously explained, the etch stop 311 can be used to prevent non-uniform etching of the lower steps in the staircase structure, according to some embodiments. Although eight holes 314 are shown, any number of holes 314 can be provisioned (e.g., depending on desired number of capacitors). Any number of dry and/or wet etch processes that are selective to etch stop 311 (if present) and/or staircase material(s) can be used to etch the contact holes 314 down into insulator fill 310. For instance, in one specific embodiment, a dry etch process can be used that has an etch selectivity of material included in etch stop 311 (if present) and/or staircase material(s) relative to insulator fill 310 that is greater than 15:1, meaning that the insulator fill 310 etches more than 15 times faster than such material(s). Note that etch stop 311 (if present) and/or staircase material(s) may be etched somewhat during the contact hole formation process, but will not be penetrated by that etch process, according to an embodiment. To this end, further note that etch stop 311 can be used to prevent non-uniform recess into uppermost layer of each step, and therefore further prevents unintended punch through of layers 306.

In some cases that include etch stop 311, once the etch of insulator fill material 310 lands on or within etch stop 311, the etch scheme can be transitioned to one that will more readily remove the etch stop 311 to expose the underlying layers 306. In such a case, the etch is selective to the insulator fill material 310 as well as layer 306 material, and more aggressively removes etch stop 311 material. The etch utilized will therefore depend on the materials used, as will be appreciated. In some example embodiments, selective wet and/or dry etches that are selective to silicon dioxide can be used to remove etch stop 311 from the bottom of the holes 314. For example, in one such specific embodiment, insulator fill material 310 and layers 306 include silicon dioxide and etch stop 311 includes a single layer of aluminum oxide, and a halide-based dry etch or a hydrofluoric-based wet etch that is selective to silicon dioxide is used to selectively remove etch stop 311. Any number of selective etch schemes can be used, and other materials systems can be used that provide the desired etch selectivity.

Figure 3H:
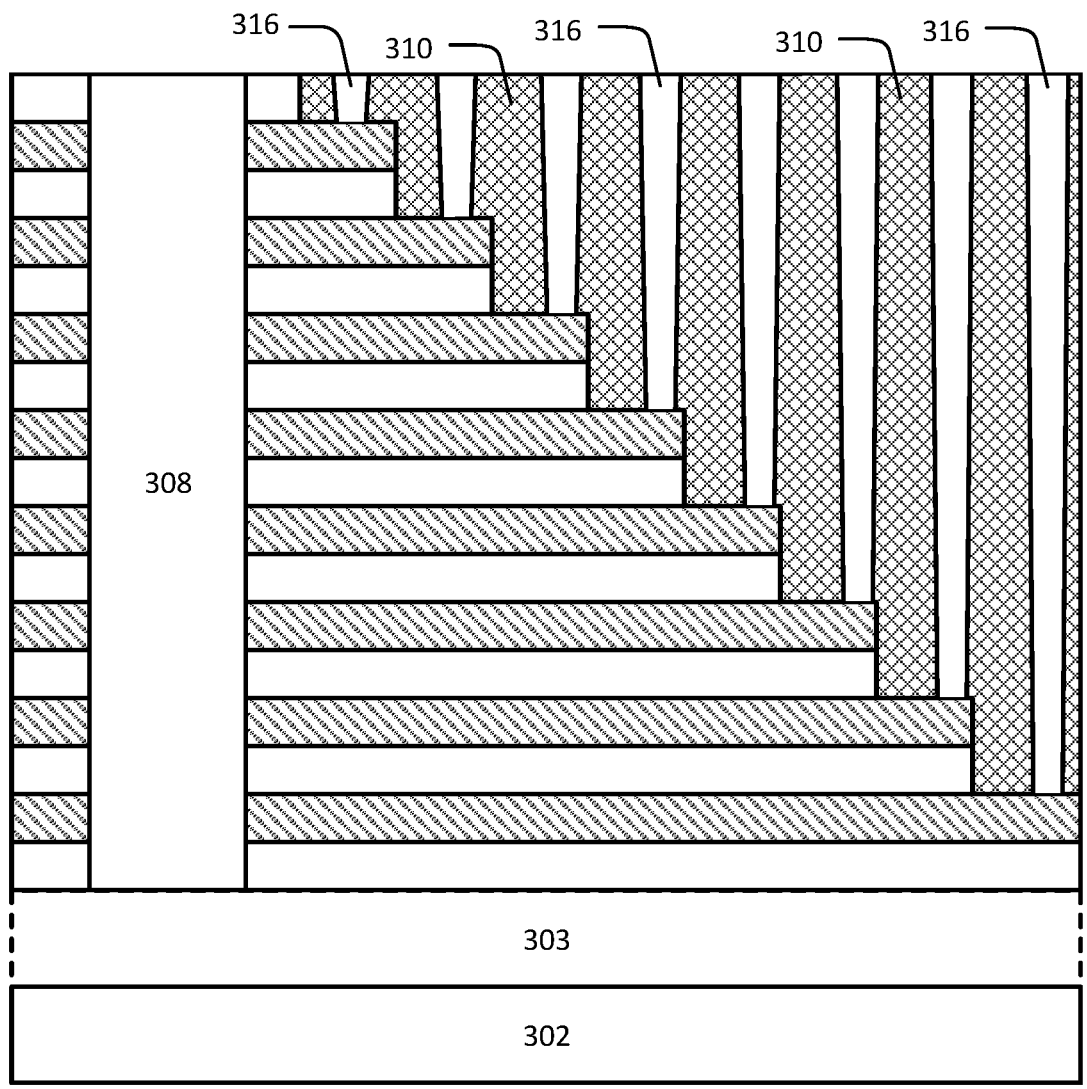

FIG. 3H shows the structure of FIG. 3G after holes 314 have been filled with conductive material to form contacts 316, and after mask 312 has been removed, in accordance with an embodiment. The conductive material can be deposited using any suitable deposition technique, such as ALD, CVD, and/or PVD. Any excess deposited conductive material may be removed (e.g., by way of CMP) along with hardmask 312 to make the top surface of contacts 316 co-planar (or substantially co-planar) with a top surface of the staircase structure. Example conductive materials include polysilicon, tungsten, molybdenum, ruthenium, aluminum, nickel, silver, and copper, to name a few examples. In some example embodiments, note that contacts 316 may include multiple components or layers, such as a barrier layer or liner (e.g., titanium or titanium nitride, tantalum or tantalum nitride) to prevent migration of the conductive material into insulator fill 310.

The height or length of contacts 316 can vary from one embodiment to the next, but in one example case, the shortest contact 316 is about 50 nm to 300 nm tall (e.g., ~150 nm), and the tallest contact 316 is about 300 nm to 10 microns tall (e.g., ~1 micron). The diameter or width of the contacts 316 can vary as well, but in some embodiments is in the range of about 25 nm to 250 nm. The shape of the contact holes 314 (as well as contacts 316) may also vary from one embodiment to the next, depending on factors such as mask shape and hole etch process, but in some cases the holes 314 (and contacts 316) are round. Other hole/via shapes might include, for instance, ovoid-shaped or trench-shaped or rectangular-shaped or square-shaped, or any other shape. Further note that the width may change along the height of the contact hole, such as in cases where the hole is tapered from a first width near the bottom of a given hole 314 to a relatively greater width at the top of that hole 314.

As will be further appreciated, note that the height-to-width aspect ratio of the tallest contacts 316 (or holes 314) can be very high, such as 5:1 or higher. For instance, for a contact hole 314 (or contact 316) having an average diameter in the range of about 50 nm and a height in the range of about 500 nm, the height-to-width aspect ratio would be in the range of about 10:1.

Figure 3I:
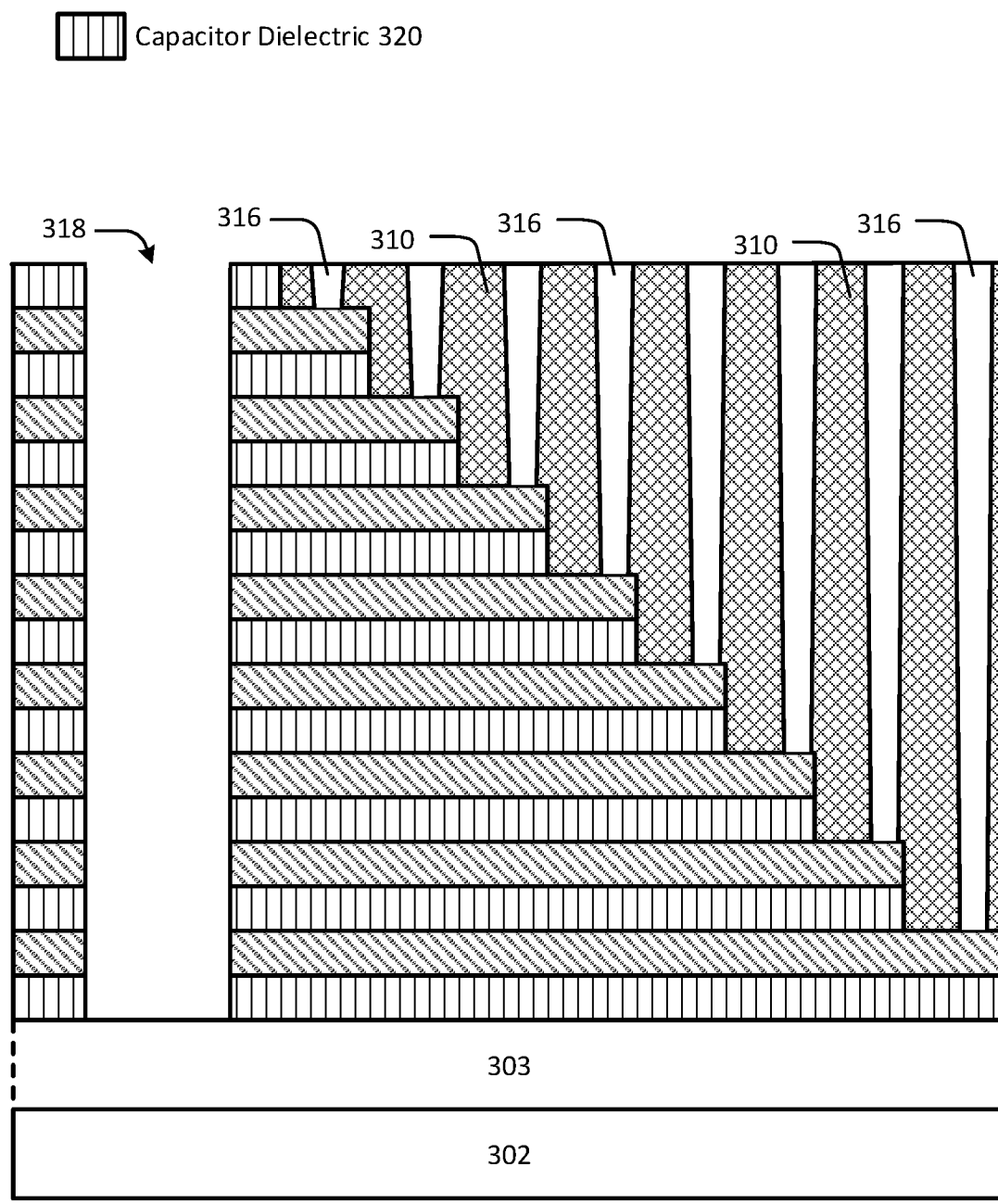

FIG. 3I shows the structure of FIG. 3H after slot or recess 318 has been opened, and layers 304 have been removed and replaced with capacitor dielectric material 320, in accordance with an embodiment. Material 308 can be removed from recess using any number of techniques, such as a lithographic process that includes patterning a mask that has an opening which corresponds to the opening of recess 318 and isotropically etching material 308 to form recess 318. Alternatively, or in addition, an anisotropic etch that is selective to layers 306 (e.g., silicon carbide), fill material 310 (e.g., silicon dioxide), and contacts 316 (e.g., tungsten), but that will readily remove material 308 (e.g., silicon nitride), can be used. Other such selective etch schemes can be used, depending on the materials in place. Once recess 318 is opened, layers 304 of the stack can be removed. In some example cases, layers 304 are the same material as material 308 (e.g., silicon nitride) and thus can be removed by the same isotropic etch scheme, according to some embodiments. Other embodiments may include changing the etch chemistry as needed to remove layers 304. Capacitor dielectric material 320 can be, for example, any number of high-k dielectrics as previously noted, which can be deposited using, for instance, ALD and/or CVD.

Figure 3J:
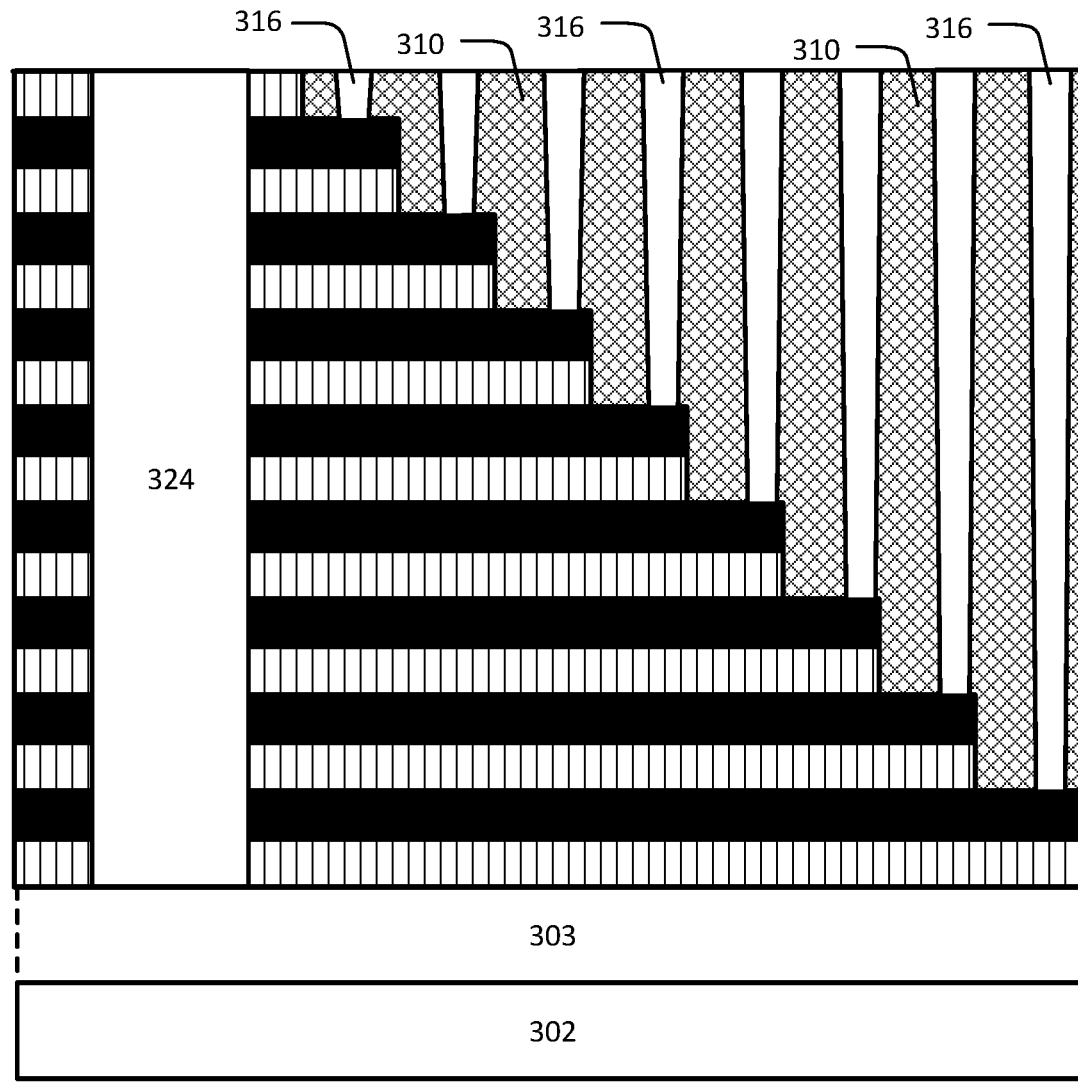

FIG. 3J shows the structure of FIG. 3I after layers 306 have been removed and replaced with capacitor electrode plate material 322, and after slot 318 has been filled with insulator material 324, in accordance with an embodiment. In one such example, an isotropic etch that is selective to layers 320 (e.g., hafnium oxide, hafnium aluminum oxide, hafnium zirconium oxide), fill material 310 (e.g., silicon dioxide), and contacts 316 (e.g., tungsten, ruthenium), but that will readily etch layers 306 (e.g., silicon carbide), can be used. Other such selective etch schemes can be used, depending on the materials in place. Capacitor electrode plate material 322 can be, for example, any number of conductive materials as previously noted, which can be deposited using, for instance, ALD and/or CVD. Insulator material 324 can be any number of insulator materials (e.g., oxides, nitrides, carbides) and can be deposited by way of CVD, ALD or other suitable deposition technique.

Figure 3K:
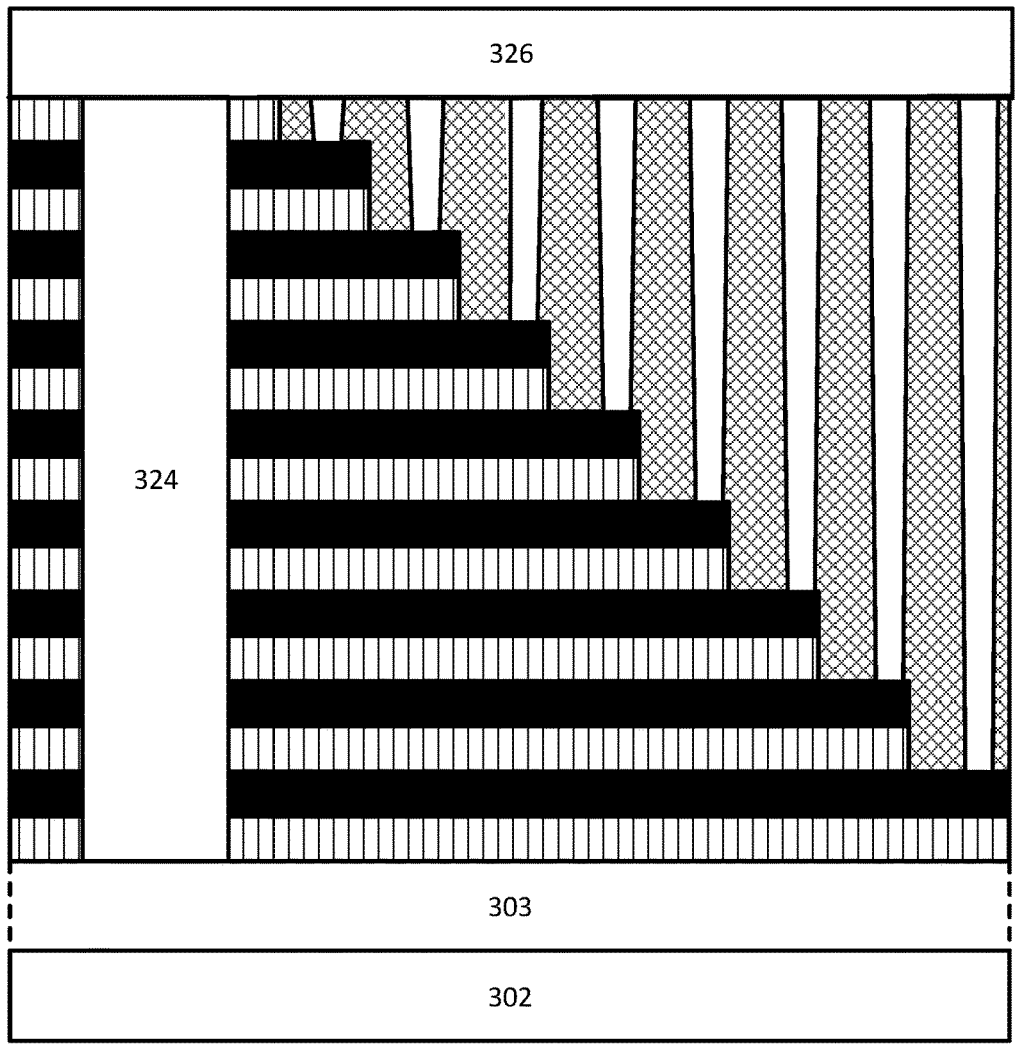
Figure 3K:
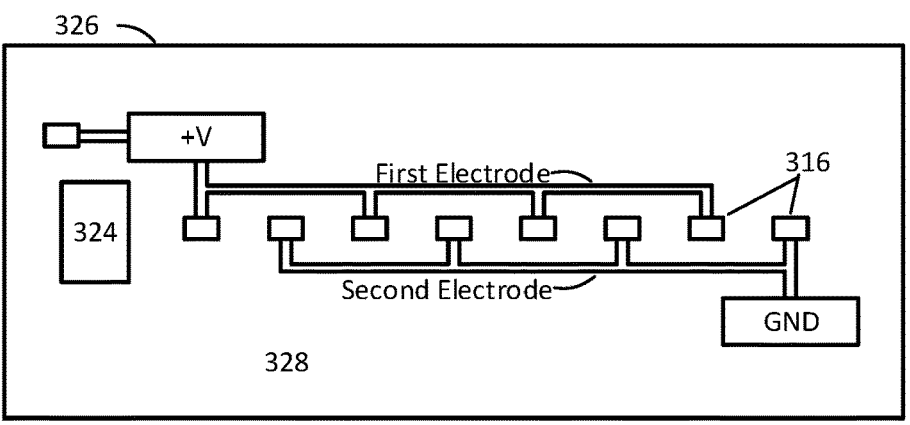

FIG. 3K shows the structure of FIG. 3J after interconnect structure 326 is formed. Interconnect structure can include any number of interconnect layers, similar to interconnect structure 303, and that previous relevant discussion is equally applicable here. FIG. 3K' shows a top down plan view a layer of structure 326 this is adjacent the top surface of the staircase structure. As can be seen, the odd numbered contacts 316 (from left to right) are connected to a first electrode, and the even numbered contacts 316 are connected to a second electrode. The first electrode is in turn connected to a power rail (+V), and the second electrode is connected to a ground plane (GND). The power supply signal provided by the power rail is thus filtered by a multi-plate MIM capacitor, and can be routed to other locations within the integrated circuit, such as down to an underlying device layer.

Figure 4A:
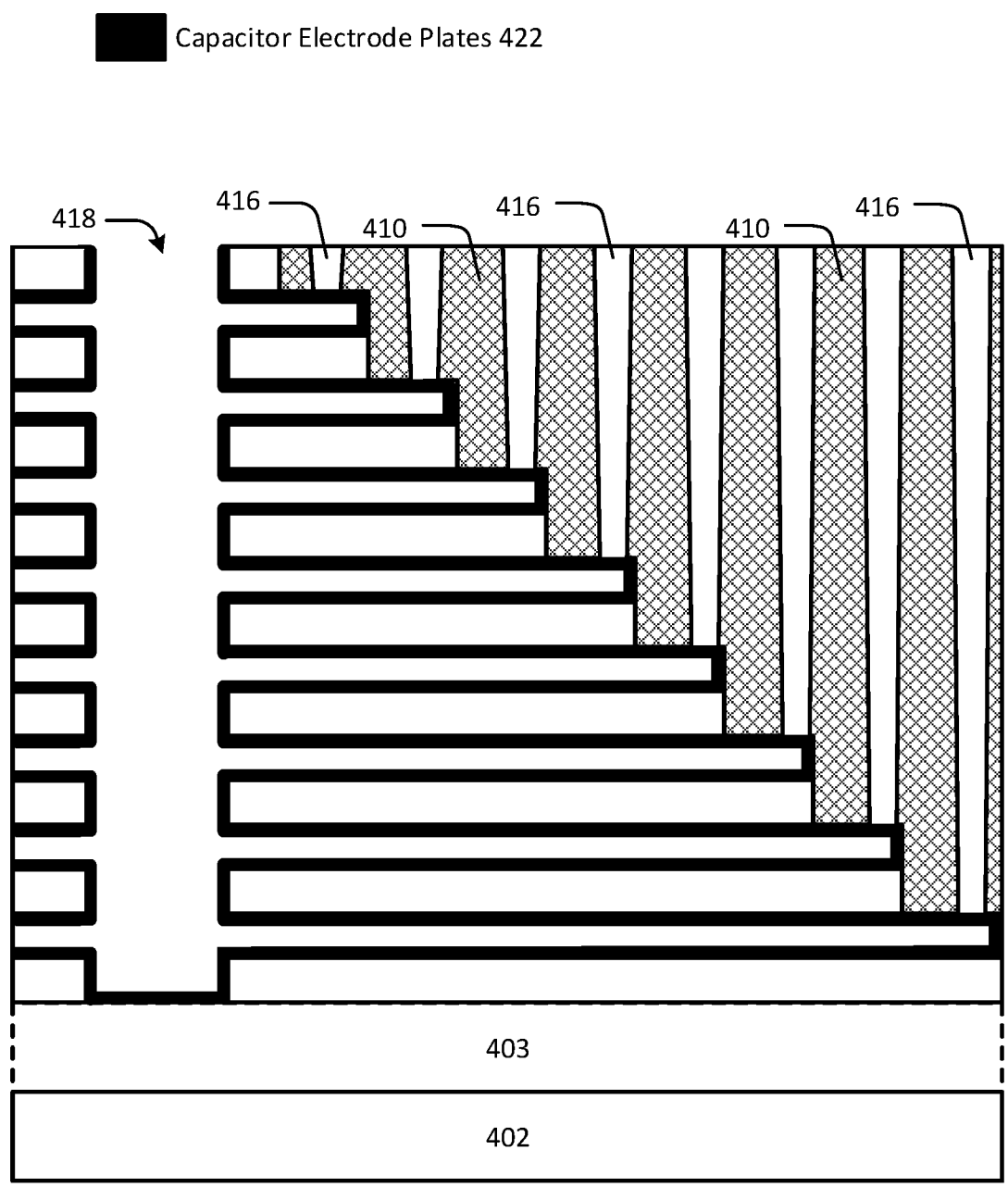
FIGS. 4A-4C collectively illustrate cross-sectional views of example integrated circuit structures formed at different points during a process for forming a multi-plate MIM capacitor implemented with a staircase structure, in accordance with another embodiment of the present disclosure.
Figure 4B:
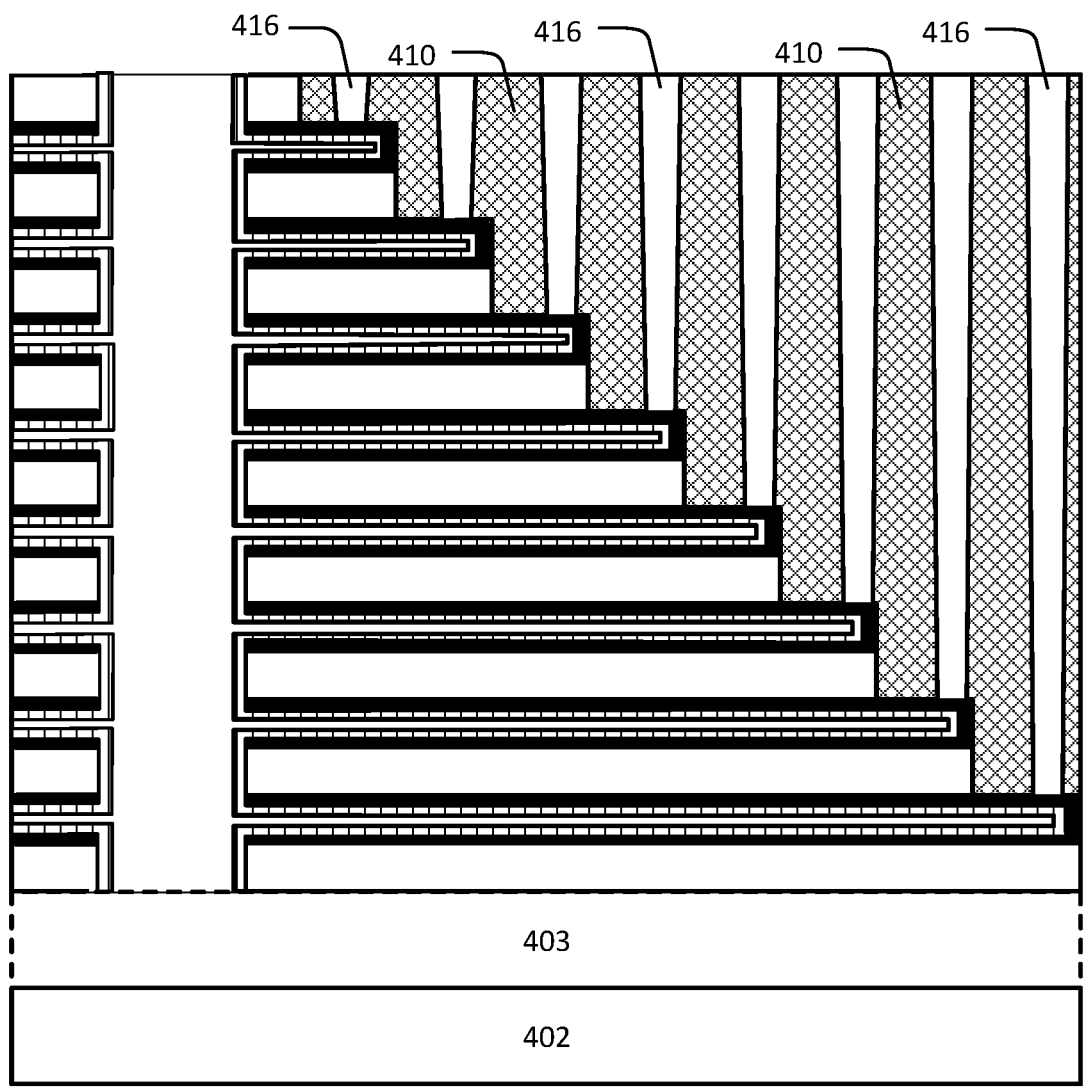
Figure 4C:
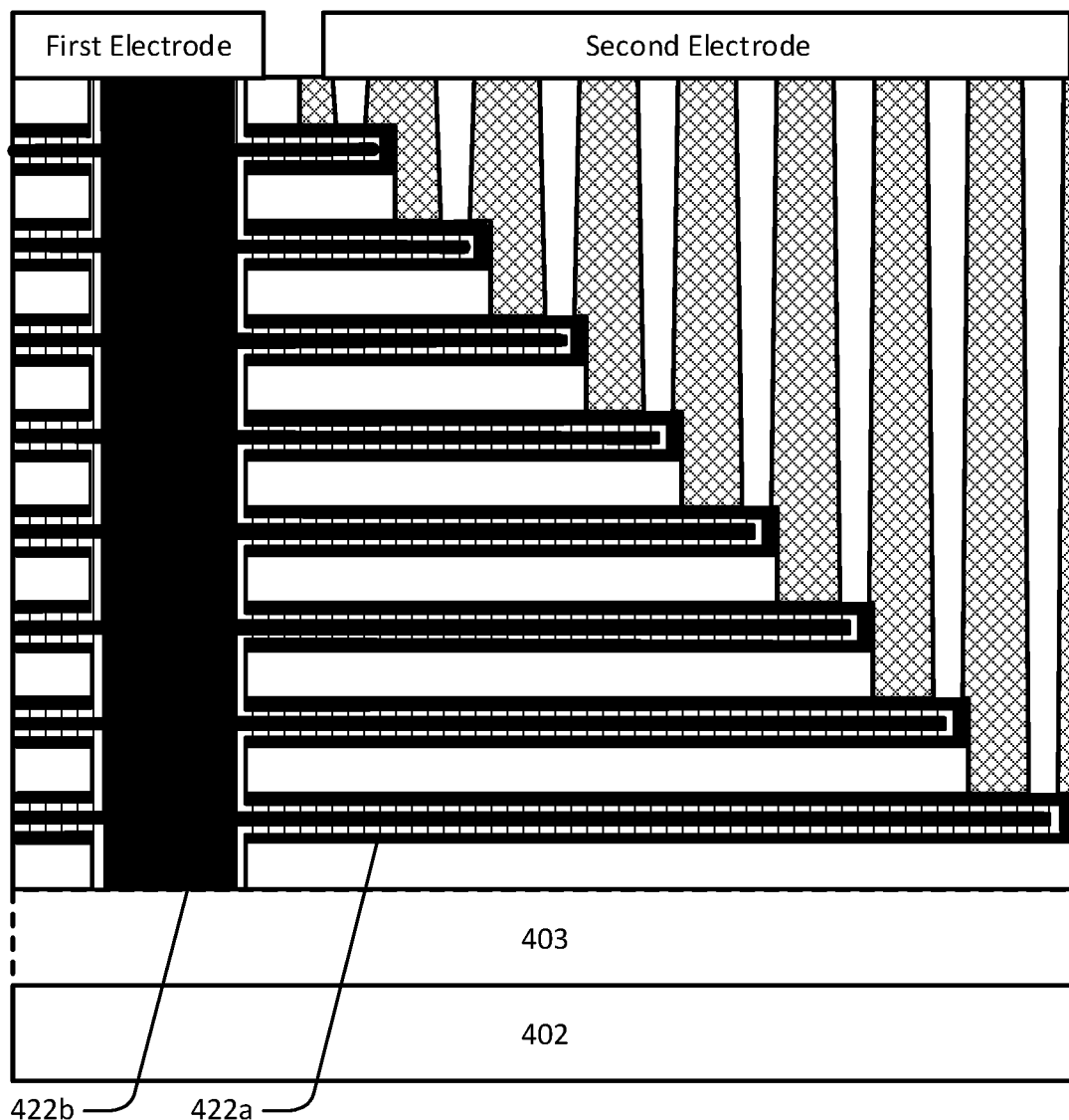

FIGS. 4A-4C collectively illustrate cross-sectional views of example integrated circuit structures formed at different points during a process for forming a multi-plate MIM capacitor implemented with a staircase structure, in accordance with another embodiment of the present disclosure. Such a process can be used to form, for example, multi-plate MIM capacitor 100b. For this example, note that the previous discussion with respect to FIGS. 3A-3H is equally applicable here, and FIG. 4A picks up the processing thereafter as will now be explained.

FIG. 4A shows the structure of FIG. 3H after slot or recess 418 has been opened, and layers 306 have been removed and replaced with capacitor electrode plate material 422a, in accordance with an embodiment. Material 308 can be removed from recess 418 using any number of techniques, such as a lithographic process that includes patterning a mask that has an opening which corresponds to the opening of recess 418 and isotropically etching material 308 to form recess 418. Alternatively, or in addition, an anisotropic etch that is selective to layers 304 (e.g., silicon carbide), fill material 310 (e.g., silicon dioxide), and contacts 316 (e.g., tungsten), but that will readily remove material 308 (e.g., silicon nitride), can be used. Other such selective etch schemes can be used, depending on the materials in place. Once recess 418 is opened, layers 306 of the stack can be removed. In some example cases, layers 306 are the same material as material 308 (e.g., silicon nitride) and thus can be removed by the same isotropic etch scheme. Other embodiments may include changing the etch chemistry as needed to remove layers 306. Capacitor electrode plate material 422a can be, for example, any number of conductive materials as previously noted, which can be conformally deposited using, for instance, ALD and/or CVD. The thickness of the conformal layer of electrode plate material 422a can vary from one embodiment to the next, but in some cases is in the range of about 3 nm to 30 nm.

FIG. 4B shows the structure of FIG. 4A after excess electrode plate material 422a has been removed from the sides and bottom of recess 418, and after capacitor dielectric material 420 has been conformally deposited, in accordance with an embodiment. Capacitor dielectric material 420 can be, for example, any number of high-k dielectrics as previously noted, which can be conformally deposited using, for instance, ALD and/or CVD. The thickness of the conformal layer of capacitor dielectric material 420 can vary from one embodiment to the next, but in some cases is in the range of about 3 nm to 30 nm. Note that excess electrode plate material 422a can be removed from the sides and bottom of recess 418 by, for example, an anisotropic or directional etch (e.g., dry etch).

FIG. 4C shows the structure of FIG. 4B after capacitor electrode plate material 422b has been conformally deposited, in accordance with an embodiment. Capacitor electrode plate material 422b can be, for example, any number of conductive materials as previously noted, which can be conformally deposited using, for instance, ALD and/or CVD. In some embodiments, capacitor electrode plate materials 422a and 422b are the same. The thickness of the conformal layer of electrode plate material 422b can vary from one embodiment to the next, but in some cases is in the range of about 3 nm to 30 nm (similar to 422a). Note how electrode plate 422b provides a common electrode to all electrode plates 422a. In this example case, a first electrode (or interconnect conductor) is connected to that common electrode plate 422b, and a second electrode (or interconnect conductor) is connected the electrode plates 422a by way of contacts 416. Other connection schemes can be used, as previously explained.

Figure 5A:
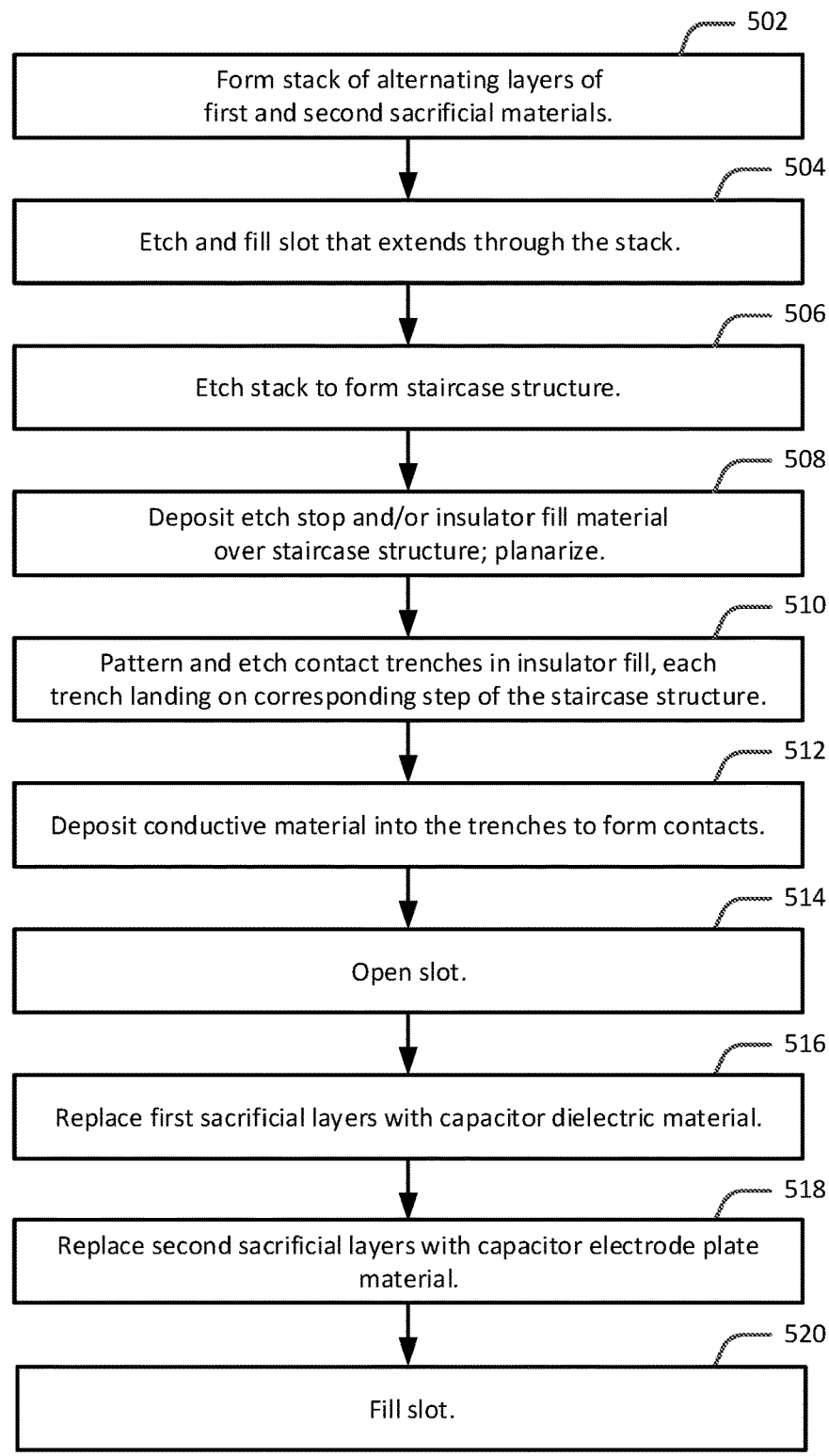
FIG. 5A-5B are each a flowchart illustrating a process for forming a multi-plate MIM capacitor implemented with a staircase structure, in accordance with an embodiment of the present disclosure.

FIG. 5A is a flowchart illustrating a process for forming a multi-plate MIM capacitor implemented with a staircase structure, in accordance with an embodiment of the present disclosure. Such a process can be used to form, for example, multi-plate MIM capacitor 100a.

As can be seen, the processing includes forming 502 a stack of alternating layers of first and second sacrificial materials. The first and second sacrificial materials may be, for example, silicon dioxide and silicon nitride, or silicon carbide and silicon nitride, or another pair of materials that provide the desired etch selectively with both respect to each other as well as with respect to other materials that may be exposed during the relevant process.

The method continues with etching and filling 504 a slot or recess that extends through the stack of alternating materials. As previously explained, the depth of the recess can vary. The method continues with etching 506 the stack to form a staircase structure, and depositing 508 an etch stop layer and/or insulator fill material over staircase structure, as previously explained. The resulting structure can be planarized (e.g., CMP process), to remove excess materials.

The method continues with patterning and etching 510 contact trenches in the insulator fill material, each trench landing on corresponding step of the staircase structure, and then depositing 512 conductive material into the trenches to form contacts. The method continues with opening 514 the slot or recess, and replacing 516 the first sacrificial layers with capacitor dielectric material. Recall that the etch that removes the first sacrificial material is selective to the second sacrificial material. The method continues with replacing 518 the second sacrificial layers with capacitor electrode plate material, and filling 520 the slot. Recall that the etch that removes the second sacrificial material is selective to the capacitor dielectric material.

Figure 5B:
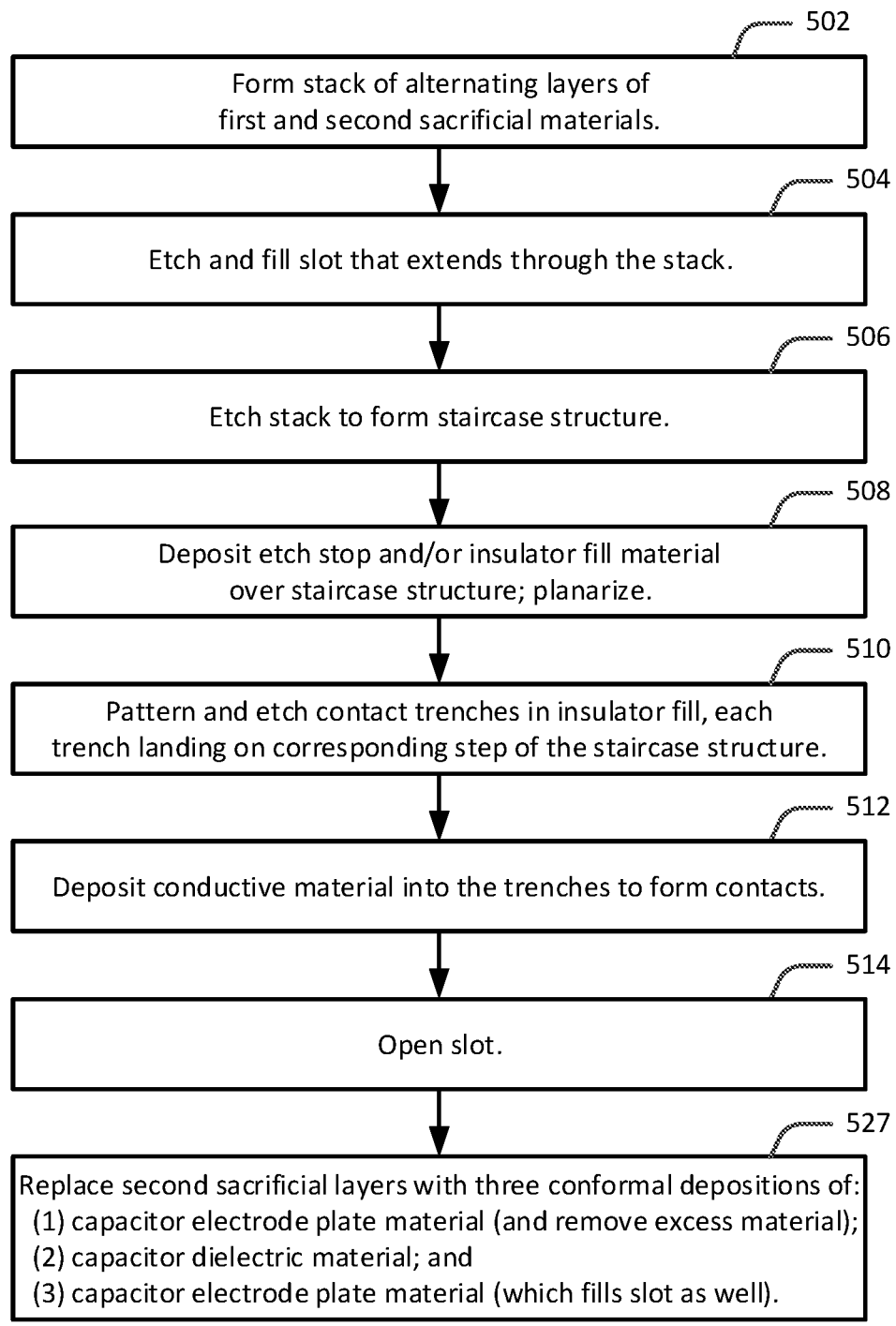

FIG. 5B is a flowchart illustrating a process for forming a multi-plate MIM capacitor implemented with a staircase structure, in accordance with another embodiment of the present disclosure. Such a process can be used to form, for example, multi-plate MIM capacitor 100b. As can be seen, the method of FIG. 5A is similar to method of FIG. 5B, in that they share 502 through 514, and the previous relevant discussion is equally applicable here. The method of FIG. 5B continues with replacing 527 the second sacrificial layers with three conformal depositions of: (1) capacitor electrode plate material (and remove excess material); (2) capacitor dielectric material; and (3) capacitor electrode plate material (which fills slot as well).

Example System

Figure 6:
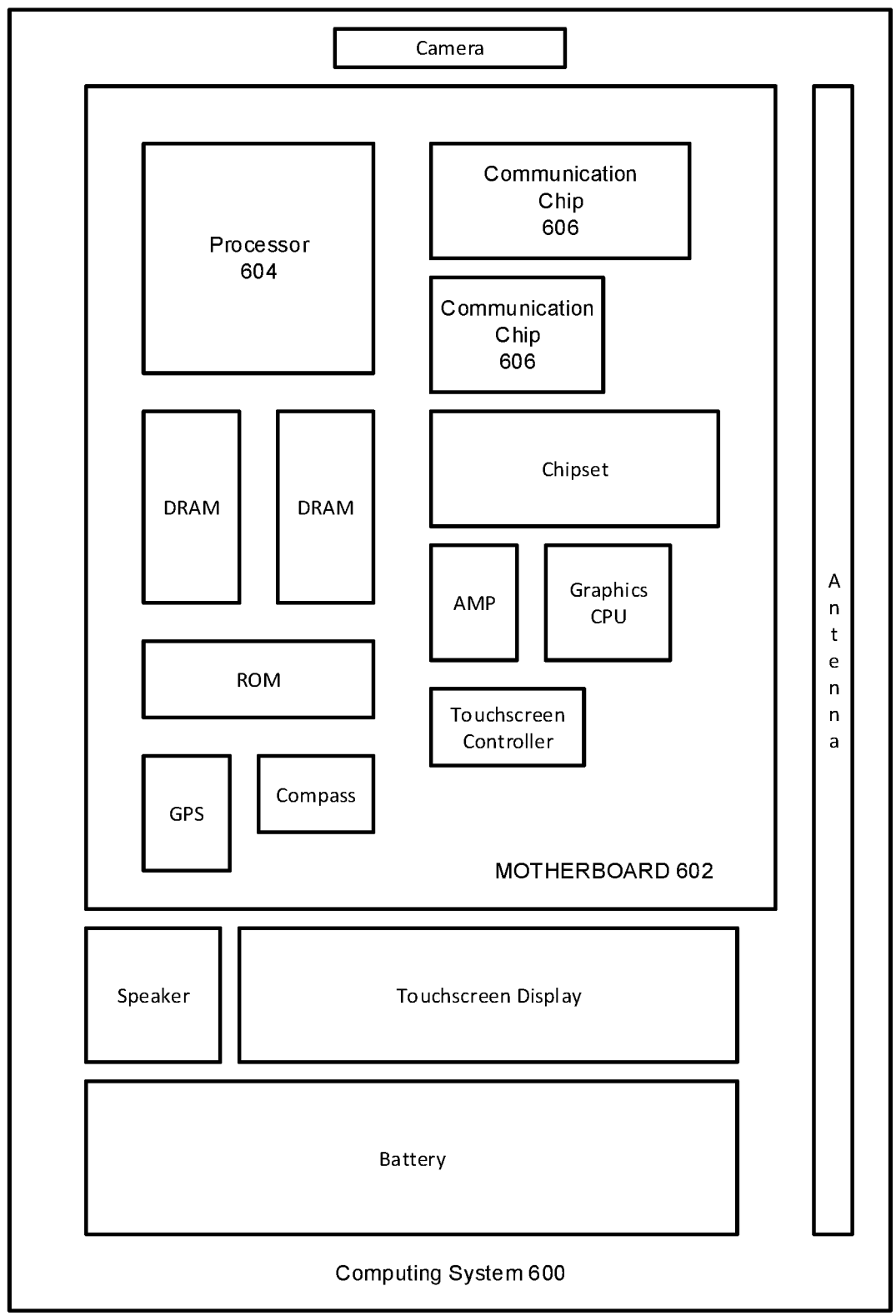
FIG. 6 is an example computing system implemented with one or more integrated circuit structures configured in accordance with an embodiment of the present disclosure.

FIG. 6 is an example computing system 600 implemented with one or more of the integrated circuit structures as disclosed herein, in accordance with an embodiment of the present disclosure. As can be seen, computing system 600 houses a motherboard 602. Motherboard 602 may include a number of components, including, but not limited to, a processor 604 and at least one communication chip 606, each of which can be physically and electrically coupled to motherboard 602, or otherwise integrated therein. As will be appreciated, motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to motherboard 602. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with the disclosed techniques in accordance with an example embodiment (e.g., a staircase-based multi-plate MIM capacitor, as variously described herein). In some embodiments, multiple functions can be integrated into one or more chips (e.g., for instance, note that communication chip 606 can be part of or otherwise integrated into processor 604).

Communication chip 606 enables wireless communications for the transfer of data to and from computing system 600. The term wireless and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 606 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1x evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. Computing system 600 may include multiple communication chips 606. For instance, a first communication chip 606 may be dedicated to shorter range wireless communications such as Wi-Fi and Bluetooth, and a second communication chip 606 may be dedicated to longer range wireless communications such as GPS, EDGE, GPRS, CDMA, WiMAX, LTE, Ev-DO, and others. In some embodiments, communication chip 606 may include one or more staircase-based multi-plate MIM capacitors as variously described herein.

Processor 604 of computing system 600 includes an integrated circuit die packaged within processor 604. In some embodiments, the integrated circuit die of the processor includes onboard circuitry that is implemented with one or more integrated circuit structures or devices formed using techniques as variously described herein (e.g., staircase-based multi-plate MIM capacitor). The term processor may refer to any device or portion of a device that processes, for instance, electronic data from registers and/or memory to transform that electronic data into other electronic data that may be stored in registers and/or memory.

Communication chip 606 also may include an integrated circuit die packaged within communication chip 606. In accordance with some such example embodiments, the integrated circuit die of the communication chip includes one or more integrated circuit structures or devices formed using techniques as variously described herein (e.g., staircase-based multi-plate MIM capacitor). As will be appreciated in light of this disclosure, note that multi-standard wireless capability may be integrated directly into processor 604 (e.g., where functionality of any chips 606 is integrated into processor 604, rather than having separate communication chips). Further note that processor 604 may be a chipset having such wireless capability. In short, any number of processors 604 and/or communication chips 606 can be used. Likewise, any one chip or chipset can have multiple functions integrated therein.

In various implementations, computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using techniques as variously described herein.

FURTHER EXAMPLE EMBODIMENTS

The following examples pertain to further embodiments, from which numerous permutations and configurations will be apparent.

Example 1 includes an integrated circuit including: a staircase structure, wherein first and second steps included in the staircase structure each includes a high-k dielectric material layer and a conductive material layer, each conductive material layer being an electrode plate of a multi-plate capacitor; an insulator fill material over the staircase structure; a first contact that passes through the insulator fill material and is on the electrode plate of the first step; and a second contact that passes through the insulator fill material and is on the electrode plate of the second step.

Example 2 includes the integrated circuit of Example 1, and includes an etch stop on the staircase structure, the etch stop including a high-k dielectric material, wherein the first and second contacts also pass through the etch stop.

Example 3 includes the integrated circuit of Example 2, wherein the high-k dielectric material of the etch stop is elementally distinct from the high-k dielectric material of the first and second steps of the staircase structure.

Example 4 includes the integrated circuit of any one of Examples 1 through 3, and includes a recess that passes through each of the first and second steps of the staircase structure.

Example 5 includes the integrated circuit of Example 4, wherein the recess is filled with insulator material.

Example 6 includes the integrated circuit of Example 5, wherein the electrode plate of the first step is the only electrode plate of the first step, and the electrode plate of the second step is the only electrode plate of the second step.

Example 7 includes the integrated circuit of Example 4, wherein the recess is filled with conductive material, and provides another electrode plate of the multi-plate capacitor.

Example 8 includes the integrated circuit of Example 7, wherein: the electrode plate of the first step is a first electrode plate of the first step, the first step further including a second electrode plate that is continuous with, or otherwise in contact with, the conductive material in the recess, and the high-k dielectric material layer of the first step is between the first and second electrodes of the first step; and the electrode plate of the second step is a first electrode plate of the second step, the second step further including a second electrode plate that is continuous with, or otherwise in contact with, the conductive material in the recess, and the high-k dielectric material layer of the second step is between the first and second electrodes of the second step.

Example 9 includes the integrated circuit of Example 7, and includes: a first conductive interconnect feature in contact with one or both of the first and second contacts; and a second conductive interconnect feature in contact with the conductive material in the recess.

Example 10 includes the integrated circuit of any one of Examples 1 through 9, and includes a first conductive interconnect feature in contact with the first contact; and a second conductive interconnect feature in contact with the second contact.

Example 11 includes the integrated circuit of Example 10, wherein the first conductive interconnect feature is in contact with a power rail (e.g., buried power rail or backside power rail), and the second conductive interconnect feature is in contact with a ground plane.

Example 12 is an integrated circuit comprising: a device layer including a plurality of transistor devices; an interconnect structure including one or more interconnect layers above or below the device layer; a staircase structure included in one or more of the one or more interconnect layers, wherein first and second steps included in the staircase structure each includes a high-k dielectric material layer and a conductive material layer, each conductive material layer being an electrode plate of a multi-plate capacitor; an insulator fill material over the staircase structure; a first contact that passes through the insulator fill material and is on the electrode plate of the first step; and a second contact that passes through the insulator fill material and is on the electrode plate of the second step.

Example 13 includes the integrated circuit of Example 12, and includes an etch stop on the staircase structure, wherein each of the first and second contacts also passes through the etch stop.

Example 14 includes the integrated circuit of Example 12 or 13, and includes a recess that passes through each of the first and second steps of the staircase structure.

Example 15 includes the integrated circuit of Example 14, wherein the recess is filled with insulator material.

Example 16 includes the integrated circuit of Example 14 or 15, wherein the electrode plate of the first step is the only electrode plate of the first step, and the electrode plate of the second step is the only electrode plate of the second step.

Example 17 includes the integrated circuit of Example 14, wherein the recess is filled with conductive material, and provides another electrode plate of the multi-plate capacitor.

Example 18 includes the integrated circuit of Example 17, wherein: the electrode plate of the first step is a first electrode plate of the first step, the first step further including a second electrode plate that is continuous with, or otherwise in contact with, the conductive material in the recess, and the high-k dielectric material layer of the first step is between the first and second electrodes of the first step; and the electrode plate of the second step is a first electrode plate of the second step, the second step further including a second electrode plate that is continuous with, or otherwise in contact with, the conductive material in the recess, and the high-k dielectric material layer of the second step is between the first and second electrodes of the second step.

Example 19 includes the integrated circuit of Example 17 or 18, and includes: a first conductive interconnect feature in contact with one or both of the first and second contacts; and a second conductive interconnect feature in contact with the conductive material in the recess.

Example 20 includes the integrated circuit of any one of Examples 12 through 19, and includes: a first conductive interconnect feature in contact with the first contact; and a second conductive interconnect feature in contact with the second contact; wherein the first conductive interconnect feature is in contact with a power rail, and the second conductive interconnect feature is in contact with a ground plane.

Example 21 is an integrated circuit comprising: a staircase structure including a plurality of steps, wherein each of the steps included in the staircase structure each includes a high-k dielectric material layer and a conductive material layer, each conductive material layer being an electrode plate of a multi-plate capacitor; an insulator fill material over the steps of the staircase structure; a first contact that passes through the insulator fill material and is on the electrode plate of a first step of the first staircase structure; a second contact that passes through the insulator fill material and is on the electrode plate of a second step of the staircase structure; a third contact that passes through the insulator fill material and is on the electrode plate of a third step of the staircase structure; a fourth contact that passes through the insulator fill material and is on the electrode plate of a fourth step of the staircase structure; and a recess that passes through each of the steps of the staircase structure.

Example 22 includes the integrated circuit of Example 21, and includes: an etch stop on the staircase structure, wherein each of the first, second, third and fourth contacts also passes through the etch stop.

Example 23 includes the integrated circuit of Example 21 or 22, wherein the recess is filled with insulator material.

Example 24 includes the integrated circuit of Example 23, wherein the electrode plate of each of the first, second, third and fourth steps is the only electrode plate of that corresponding step.

Example 25 includes the integrated circuit of Example 21 or 22, wherein the recess is filled with conductive material, and provides another electrode plate of the multi-plate capacitor.

Example 26 includes the integrated circuit of Example 25, wherein: the electrode plate of each of the first, second, third and fourth steps is a first electrode plate of that corresponding step, each of the first, second, third and fourth steps further including a second electrode plate that is continuous with, or otherwise in contact with, the conductive material in the recess, and the high-k dielectric material layer of a given step is between the first and second electrodes of that corresponding step.

Example 27 includes the integrated circuit of Example 25 or 26, and includes: a first conductive interconnect feature in contact with one or more of the first, second, third, and fourth contacts; and a second conductive interconnect feature in contact with the conductive material in the recess.

Example 28 includes the integrated circuit of any one of Examples 21 through 27, and includes: a first conductive interconnect feature in contact with the first contact; and a second conductive interconnect feature in contact with the second contact; wherein the first conductive interconnect feature is in contact with a power rail, and the second conductive interconnect feature is in contact with a ground plane.

Example 29 is a memory chip including the integrated circuit of any one of Examples 1 through 28.

Example 30 is a microprocessor including the integrated circuit of any one of Examples 1 through 28.

Example 31 is an electronic device (e.g., smart phone, computing device, gaming console) including the integrated circuit of any one of Examples 1 through 28, or the memory chip of Example 29, or the microprocessor of Example 30.

The foregoing description of example embodiments of the present disclosure has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto.

What is claimed is:

1. An integrated circuit comprising:
   a staircase structure, wherein first and second steps included in the staircase structure each includes a high-k dielectric material layer and a conductive material layer, each conductive material layer being an electrode plate of a multi-plate capacitor;
   an insulator fill material over the staircase structure;
   a first contact that passes through the insulator fill material and is on the electrode plate of the first step;
   a second contact that passes through the insulator fill material and is on the electrode plate of the second step; and
   a structure that passes through each of the first and second steps of the staircase structure, wherein the structure comprises a conductive material and provides another electrode plate of the multi-plate capacitor.

2. The integrated circuit of claim 1, further comprising an etch stop on the staircase structure, the etch stop including a high-k dielectric material, wherein the first and second contacts also pass through the etch stop.

3. The integrated circuit of claim 2, wherein the high-k dielectric material of the etch stop is elementally distinct from the high-k dielectric material of the first and second steps of the staircase structure.

4. The integrated circuit of claim 1, wherein:
the electrode plate of the first step is a first electrode plate of the first step, the first step further including a second electrode plate that is continuous with, or otherwise in contact with, the structure, and the high-k dielectric material layer of the first step is between the first and second electrodes of the first step; and
the electrode plate of the second step is a first electrode plate of the second step, the second step further including a second electrode plate that is continuous with, or otherwise in contact with, the structure, and the high-k dielectric material layer of the second step is between the first and second electrodes of the second step.

5. The integrated circuit of claim 1, comprising:
a first conductive interconnect feature in contact with one or both of the first and second contacts; and
a second conductive interconnect feature in contact with the structure.

6. The integrated circuit of claim 1, comprising:
a first conductive interconnect feature in contact with the first contact; and
a second conductive interconnect feature in contact with the second contact.

7. The integrated circuit of claim 6, wherein the first conductive interconnect feature is in contact with a power rail, and the second conductive interconnect feature is in contact with a ground plane.

8. An integrated circuit comprising:
a device layer including a plurality of transistor devices;
an interconnect structure including one or more interconnect layers above or below the device layer;
a staircase structure included in one or more of the one or more interconnect layers, wherein first and second steps included in the staircase structure each includes a high-k dielectric material layer and a conductive material layer, each conductive material layer being an electrode plate of a multi-plate capacitor;
an insulator fill material over the staircase structure;
a first contact that passes through the insulator fill material and is on the electrode plate of the first step;
a second contact that passes through the insulator fill material and is on the electrode plate of the second step; and
a structure that passes through each of the first and second steps of the staircase structure, wherein the structure comprises a conductive material and provides another electrode plate of the multi-plate capacitor.

9. The integrated circuit of claim 8, further comprising an etch stop on the staircase structure, wherein each of the first and second contacts also passes through the etch stop.

10. The integrated circuit of claim 8, wherein:
the electrode plate of the first step is a first electrode plate of the first step, the first step further including a second electrode plate that is continuous with, or otherwise in contact with, the structure, and the high-k dielectric material layer of the first step is between the first and second electrodes of the first step; and
the electrode plate of the second step is a first electrode plate of the second step, the second step further including a second electrode plate that is continuous with, or otherwise in contact with, the structure, and the high-k dielectric material layer of the second step is between the first and second electrodes of the second step.

11. An integrated circuit comprising:
a staircase structure including a plurality of steps, wherein each of the steps included in the staircase structure each includes a high-k dielectric material layer and a conductive material layer, each conductive material layer being an electrode plate of a multi-plate capacitor;
an insulator fill material over the steps of the staircase structure;
a first contact that passes through the insulator fill material and is on the electrode plate of a first step of the staircase structure;
a second contact that passes through the insulator fill material and is on the electrode plate of a second step of the staircase structure;
a third contact that passes through the insulator fill material and is on the electrode plate of a third step of the staircase structure;
a fourth contact that passes through the insulator fill material and is on the electrode plate of a fourth step of the staircase structure; and
a conductive structure that passes through each of the steps of the staircase structure and provides another electrode plate of the multi-plate capacitor.

12. The integrated circuit of claim 9, wherein the etch stop includes a high-k dielectric material and the high-k dielectric material of the etch stop is elementally distinct from the high-k dielectric material of the first and second steps of the staircase structure.

13. The integrated circuit of claim 8, comprising:
a first conductive interconnect feature in contact with one or both of the first and second contacts; and
a second conductive interconnect feature in contact with the structure.

14. The integrated circuit of claim 8, comprising:
a first conductive interconnect feature in contact with the first contact; and
a second conductive interconnect feature in contact with the second contact.

15. The integrated circuit of claim 14, wherein the first conductive interconnect feature is in contact with a power rail, and the second conductive interconnect feature is in contact with a ground plane.

16. The integrated circuit of claim 11, further comprising an etch stop on the staircase structure, the etch stop including a high-k dielectric material, wherein the first, second, third, and fourth contacts also pass through the etch stop.

17. The integrated circuit of claim 16, wherein the high-k dielectric material of the etch stop is elementally distinct from the high-k dielectric material of the first, second, third, and fourth steps of the staircase structure.

18. The integrated circuit of claim 11, comprising:
a first conductive interconnect feature in contact with any one or more of the first, second, third, and fourth contacts; and
a second conductive interconnect feature in contact with the conductive structure.

19. The integrated circuit of claim 11, comprising:
a first conductive interconnect feature in contact with the first contact;
a second conductive interconnect feature in contact with the second contact;
a third conductive interconnect feature in contact with the third contact; and
a fourth conductive interconnect feature in contact with the fourth contact.

20. The integrated circuit of claim 19, wherein at least one of the first, second, third, and fourth conductive interconnect features is in contact with a power rail, and at least one of the first, second, third, and fourth conductive interconnect features is in contact with a ground plane.

\* \* \* \* \*